(12) United States Patent
Lo Giudice et al.

(10) Patent No.: US 11,328,778 B2
(45) Date of Patent: May 10, 2022

(54) METHODS AND DEVICES FOR WEAR LEVELING

(71) Applicant: STMicroelectronics S.r.l., Agrate Brianza (IT)

(72) Inventors: Gianbattista Lo Giudice, Pedara (IT); Giovanni Matranga, Catania (IT); Rosario Roberto Grasso, S. Agata Li Battiati (IT); Alberto Jose' Di Martino, Palagonia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 36 days.

(21) Appl. No.: 16/925,104

(22) Filed: Jul. 9, 2020

(65) Prior Publication Data
US 2022/0011943 A1    Jan. 13, 2022

(51) Int. Cl.
| | | |
|---|---|---|
| *G11C 16/14* | (2006.01) | |
| *G06F 3/06* | (2006.01) | |
| *G11C 16/34* | (2006.01) | |
| *G11C 16/26* | (2006.01) | |
| *G11C 16/04* | (2006.01) | |

(52) U.S. Cl.
CPC ............ *G11C 16/14* (2013.01); *G06F 3/0616* (2013.01); *G06F 3/0659* (2013.01); *G06F 3/0679* (2013.01); *G11C 16/0408* (2013.01); *G11C 16/26* (2013.01); *G11C 16/3445* (2013.01); *G11C 16/3495* (2013.01)

(58) Field of Classification Search
CPC ..................................................... G11C 16/14
See application file for complete search history.

(56) References Cited

U.S. PATENT DOCUMENTS

| | | | |
|---|---|---|---|
| 7,797,481 B2 * | 9/2010 | Lee | G06F 12/0246 |
| | | | 711/103 |
| 8,086,787 B2 | 12/2011 | Chen et al. | |
| 8,806,106 B2 | 8/2014 | Goss et al. | |
| 8,995,197 B1 * | 3/2015 | Steiner | G11C 29/021 |
| | | | 365/185.19 |
| 9,329,948 B2 | 5/2016 | Li et al. | |
| 10,147,490 B2 * | 12/2018 | Grande | G11C 16/16 |
| 10,720,217 B1 * | 7/2020 | Tran | H01L 29/42328 |
| 2007/0171729 A1 * | 7/2007 | Aritome | G11C 16/16 |
| | | | 365/185.33 |
| 2009/0080255 A1 * | 3/2009 | Arita | G11C 16/10 |
| | | | 365/185.09 |
| 2009/0154264 A1 * | 6/2009 | Kux | G11C 16/3495 |
| | | | 365/189.16 |
| 2011/0051521 A1 * | 3/2011 | Levy | G11C 11/5628 |
| | | | 365/185.19 |

(Continued)

*Primary Examiner* — Douglas King
(74) *Attorney, Agent, or Firm* — Slater Matsil, LLP

(57) ABSTRACT

A method of operating a non-volatile memory including having a first set of non-volatile memory cells and a second set of non-volatile memory cells. The first set of non-volatile memory cells and second set of non-volatile memory cells are associated with host addresses. Voltage levels are determined to erase the first and second sets of non-volatile memory cells. The first and second sets of non-volatile memory cells are disassociated from the host addresses. And, the first set of non-volatile memory cells is associated to another address based on the voltage level effective to erase the non-volatile memory cells.

19 Claims, 19 Drawing Sheets

(56) References Cited

U.S. PATENT DOCUMENTS

| | | | |
|---|---|---|---|
| 2012/0213005 A1* | 8/2012 | Lee | G11C 16/349 365/185.11 |
| 2013/0176784 A1* | 7/2013 | Cometti | G11C 16/10 365/185.11 |
| 2014/0119139 A1* | 5/2014 | Park | G11C 11/5635 365/189.15 |
| 2014/0362640 A1* | 12/2014 | Tailliet | G11C 16/16 365/185.12 |
| 2016/0099061 A1* | 4/2016 | Ziperovich | G11C 16/12 365/185.11 |
| 2017/0062057 A1* | 3/2017 | Yang | G11C 16/10 |
| 2017/0084346 A1* | 3/2017 | Yang | G11C 13/0033 |
| 2019/0107961 A1* | 4/2019 | Lee | G06F 3/0653 |

* cited by examiner

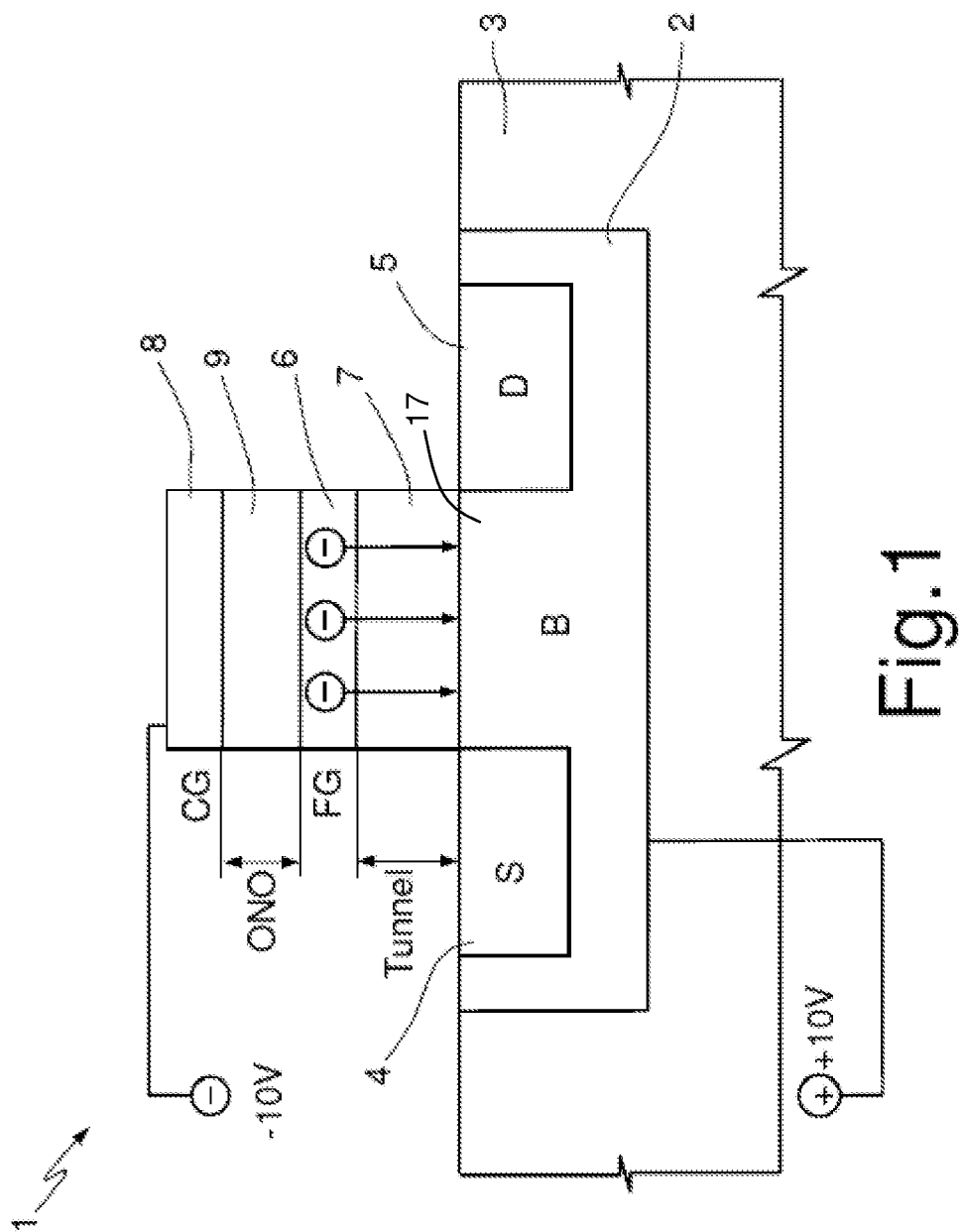

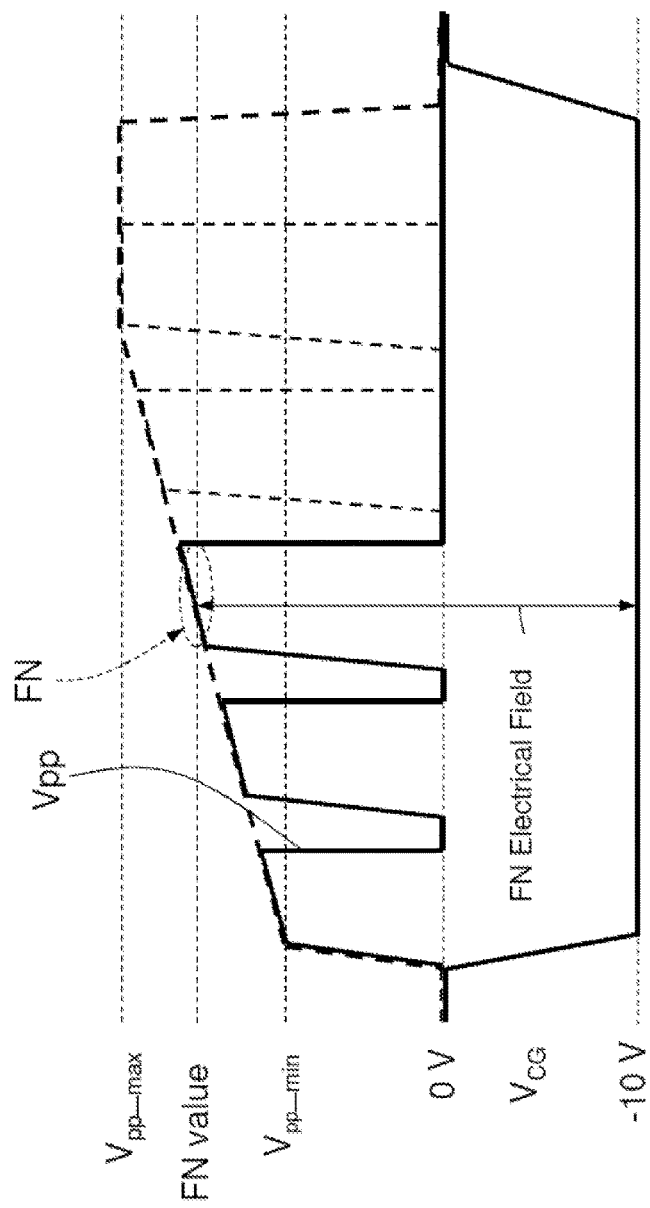

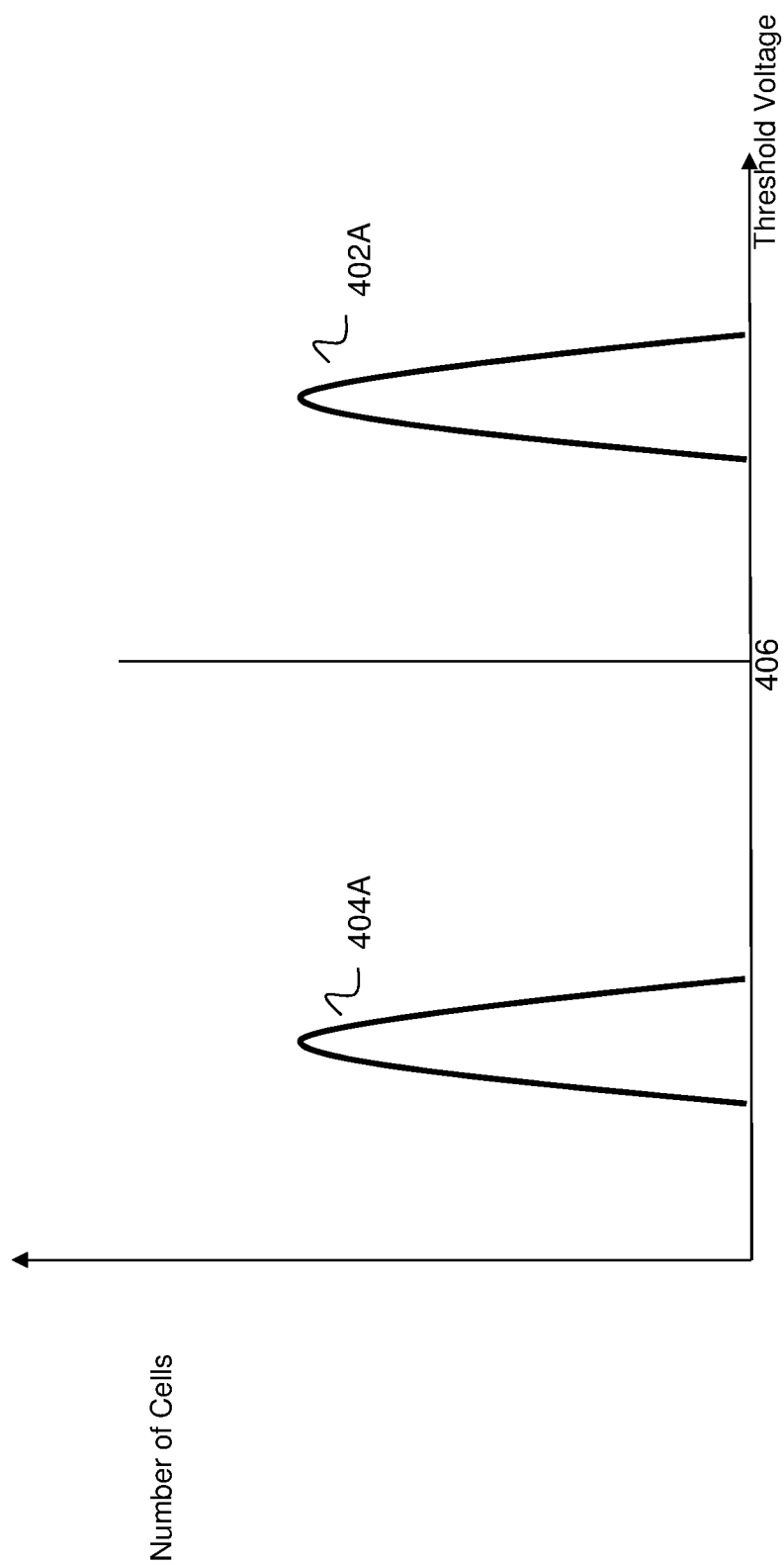

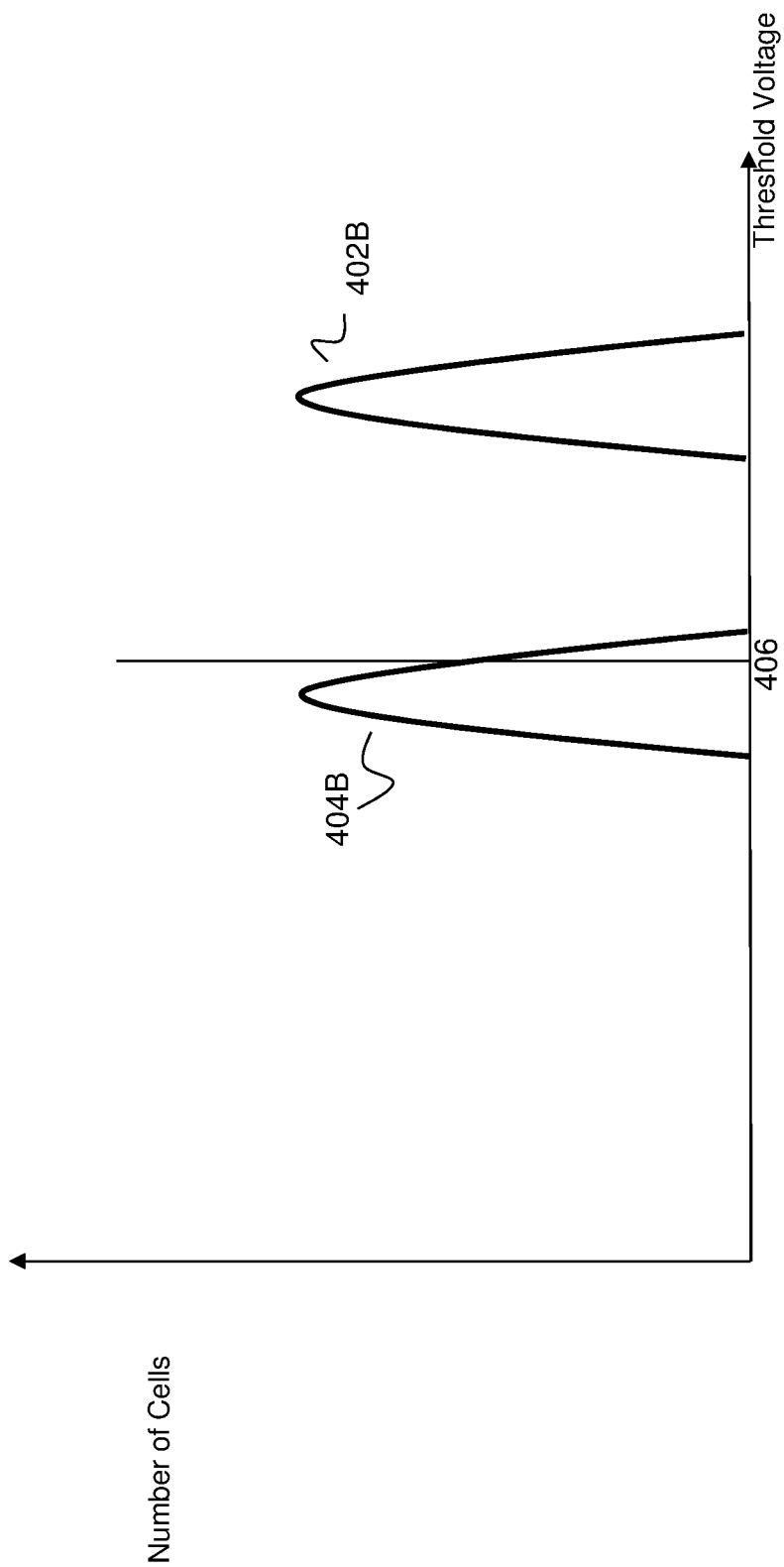

METHODS AND DEVICES FOR WEAR LEVELING

TECHNICAL FIELD

The present invention relates to methods and devices for wear leveling in non-volatile memory.

BACKGROUND

Wear leveling for non-volatile memory devices may consume more memory resources than desirable. Wear leveling methods use cycle counts to approximate wear. It may be desirable to approximate wear with the voltage level used to perform erase operations.

SUMMARY

In accordance with an embodiment of the present invention a method of operating a non-volatile memory, the method includes: having the non-volatile memory comprising a first set of non-volatile memory cells and a second set of non-volatile memory cells, the first set of non-volatile memory cells being associated with a first host address and the second set of non-volatile memory cells being associated with a second host address; determining a first voltage level effective to erase the first set of non-volatile memory cells; determining a second voltage level effective to erase the second set of non-volatile memory cells; disassociating the first set of non-volatile memory cells from the first host address; disassociating the second set of non-volatile memory cells from the second host address; and associating the first set of non-volatile memory cells to the second host address based on the first voltage level effective to erase the first set of non-volatile memory cells.

In accordance with an embodiment of the present invention a non-volatile memory device includes: a voltage-level indicator configured to store a data value indicating a voltage level used to perform an erase operation on a first set of non-volatile memory cells; and a controller in communication with the voltage-level indicator and configured to update a lookup table to associate the first set of non-volatile memory cells with a host address based on the data value.

In accordance with an embodiment of the present invention, A method for wear leveling including: having a plurality of memory locations, each memory location corresponding to a set of non-volatile memory cells of a plurality of sets of non-volatile memory cells; storing a data value in each memory location of the plurality of memory locations, the data value indicating a voltage level for performing an erase operation on the set of non-volatile memory cells corresponding to the memory location where the data value is stored; and mapping a plurality of host addresses to the plurality of sets of non-volatile memory cells in a lookup table based on the data value in each memory location of the plurality of memory locations.

BRIEF DESCRIPTION OF THE DRAWINGS

One or more embodiments will now be described, by way of example only, with reference to the annexed figures, wherein:

FIG. 1 shows a schematic cross-sectional view of a floating-gate memory cell in a non-volatile flash-memory device;

FIG. 2A shows a plot, during an erase operation, of a voltage applied to a memory cell;

FIG. 4A illustrates a distribution of threshold voltages for a plurality of memory cells of a set of memory cells before and after a single pulse has been applied to the memory cells for an erase operation using a known method;

FIG. 4B illustrates a distribution of threshold voltages for a plurality of memory cells of a set of memory cells before and after a single pulse of a subsequent erase operation using a known method;

DETAILED DESCRIPTION OF ILLUSTRATIVE EMBODIMENTS

Figure 2B:
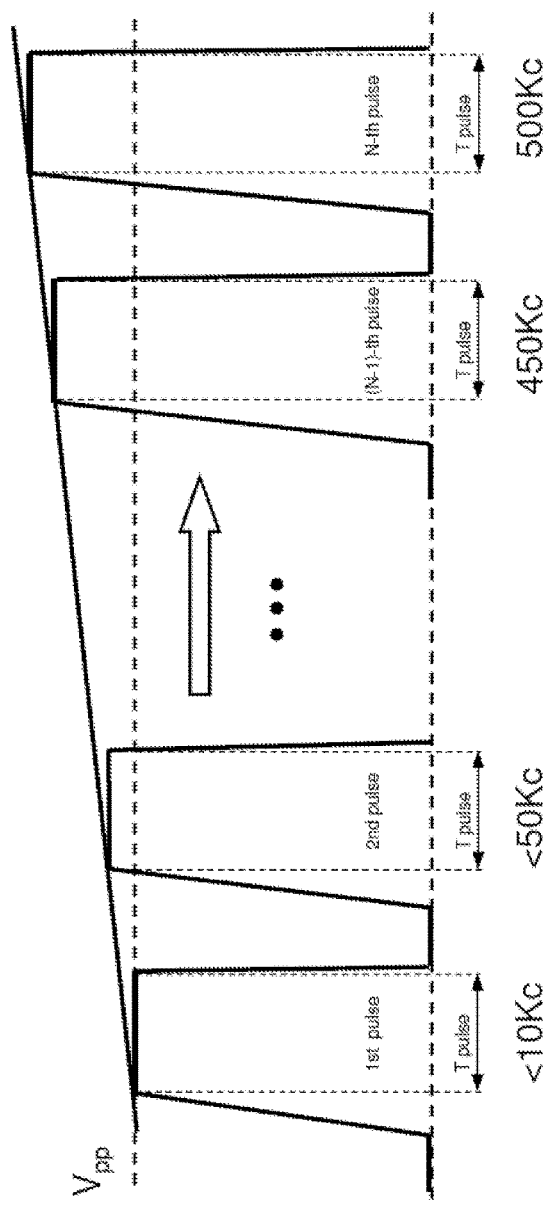
FIG. 2B shows increasing voltages required to perform an erase operation as the number of cycles increase.

Individual non-volatile memory cells of non-volatile memory devices are subject to degradation over time as more memory cycles are performed using the non-volatile memory cells. As more memory operations are performed on the non-volatile memory cells, higher voltages are required to erase the non-volatile memory cells. When a non-volatile memory device cannot apply a voltage high enough to erase one or more of the non-volatile memory cells, the non-volatile memory device may lose the ability to function. Uneven wear among the various non-volatile memory cells may cause a non-volatile memory device to cease functioning even though many of its non-volatile memory cells have little to no wear.

Non-volatile memory devices employ a variety of wear-levelling techniques to redistribute the non-volatile memory cells so the life of the non-volatile memory device can be extended. Known approaches involve counting the number of cycles performed on the non-volatile memory cells. The cycle count is used to approximate wear on the individual non-volatile memory cells and non-volatile memory cells are allocated for use based on the cycle count associated with the non-volatile memory cells. However, it may require more memory than is desirable to count the cycles performed on the non-volatile memory cells because each cell may be used hundreds of thousands of times before wearing out. Reliance on cycle counting can be avoided by a more efficient and direct way to approximate wear on a memory cell: by utilizing the level of the voltage used for erase operations.

FIG. 1 shows a schematic cross-sectional view of a floating-gate memory cell in a non-volatile memory device.

As it is known, and as shown schematically in FIG. 1, a memory cell 1, of the floating-gate type, of a non-volatile memory device, for example of a flash type, may comprise: a bulk region 2, for example, with a p-type doping, provided in a substrate 3 of semiconductor material, for example silicon. The memory cell 1 may further comprise a source region 4 and a drain region 5, for example with an n-type doping, provided within a surface portion of the bulk region 2; a floating-gate region 6, arranged above the bulk region 2 and separated from the bulk region 2 by a tunnel-oxide region 7; and a control-gate region 8, arranged above the floating-gate region 6 and separated therefrom by an intermediate oxide (the so-called "ONO") region 9.

For storing information, electric charges may be injected from the substrate 3 into the floating-gate region 6 (program operation), thus varying the threshold of the memory cell 1, i.e., the voltage to be applied between the control-gate region 8 and the source region 4 to switch-on the memory cell 1 and obtain conduction of electric current between the source region 4 and the drain region 5.

For a sensing, or reading, operation, upon application of an appropriate biasing voltage to the control-gate region 8, a sensing circuit may detect the conduction characteristic of the memory cell 1, from which it is possible to obtain the stored information.

An erase operation for erasing the information envisages removal of the electric charge stored in the floating-gate region 6, via electron extraction. In particular, this operation envisages (as illustrated in FIG. 1) application of a high electrical field between the bulk region 2, which may be brought to a high voltage of a positive value (for example +10 V), and the control-gate region 8, which may be brought to a high voltage of a negative value (for example −10 V). In a known manner, the high electrical field may trigger the Fowler-Nordheim ("FN") tunneling effect, which causes movement of the electrons, which migrate from the floating-gate region 6 through the tunnel-oxide region 7 (once again, as illustrated schematically in FIG. 1).

In particular, in a known manner, the erase operations may be carried out simultaneously on a set of memory cells 1, belonging for example to a same block, sector, or page, of a non-volatile memory device, these cells being thus erased together in a same erase operation.

The erase process may be effective when the applied electrical field has a value sufficient to trigger the FN tunneling effect.

On account of the natural process of degradation of the memory cells 1 (for example, due to charge trapping in the tunnel-oxide region 7), this value, however, increases as the so-called "cycling" (i.e., the number of program cycles, erase cycles, or both undergone by the memory cells 1) increases.

In order to take into account the degradation phenomenon, an approach commonly used for carrying out the erase operation on a set (sector or page) of memory cells 1 envisages iterative application of a certain number of pulses, of an increasing voltage value and of a fixed duration, each followed by a verify operation for verifying that the erase has been successful. The method is interrupted as soon as the verify operation determines that erase has been correctly performed.

FIG. 2A shows the plot, during an erase operation, of a voltage applied to a memory cell.

This approach is illustrated schematically in FIG. 2A, which shows the plot, with pulses of increasing value, of the bulk voltage Vpp, with the control-gate region 8 negatively selected (i.e., set at a voltage VCG of a high negative value, for example −10 V). As previously mentioned, the potential difference between the bulk region 2 and the control-gate region 8 may determine the electrical field designed to trigger the FN tunneling effect.

The pulses of the bulk voltage Vpp may start from a minimum value Vpp_min, determined in the circuit of design or characterization of the non-volatile memory device, and increase step by step by equal increments, up to a maximum value Vpp_max, which may also be determined during design or characterization of the memory device. Between successive pulses, this approach may envisage a verify step, through a reading, or sensing, operation, to verify that the erase has been successful.

If the verification does not yield a positive result, a subsequent pulse is iteratively applied, with an incremented value; otherwise, when it is verified that erase has been successful (i.e., when it is verified that the value of electrical field required for activation of the FN tunneling effect has been reached or crossed, as shown once again in FIG. 2A) the process ends.

The envelope of all the pulses applied (represented with a dashed line) may determine the slope with which the erase operation is carried out, i.e., the variation in time of the electrical field applied to the memory cells 1, and the rate at which the electrical field reaches and/or crosses the value required for activation of the FN tunneling effect. A high slope may stress the memory cells 1 and accelerate the degradation of the memory cell; this slope may impact on the duration of the erase operation and long-term performance of the memory cell.

As the number of program/erase cycles carried out on the memory cells 1 increases, the value of an electrical field required for activation of the FN tunneling effect also increases, so the number of pulses required to effectively erase of the memory cells 1 also increases.

FIG. 2B shows increasing voltages required to perform an erase operation as the number of cycles increase.

As indicated schematically in FIG. 2B, as cycling increases, the number of pulses that are required by the erase operation also increases. For example, as illustrated in FIG. 2B, the number of pulses required may increase from one or two pulses required for erasing memory cells with cycling lower than 10 Kc or 50 Kc, to a number N−1 or N of pulses (with N for example equal to 10) required for erasing memory cells with cycling of 450 Kc or 500 Kc.

An approach for reducing the number of pulses includes storing information associated with the operating configuration that has allowed a past memory operation to be successfully completed such as the voltage level applied to perform the erase operation or parameters defining the voltage level applied to perform the erase operation, and using this information for restoring the corresponding operating configuration as the starting point for a subsequent memory operation.

Figure 3A:
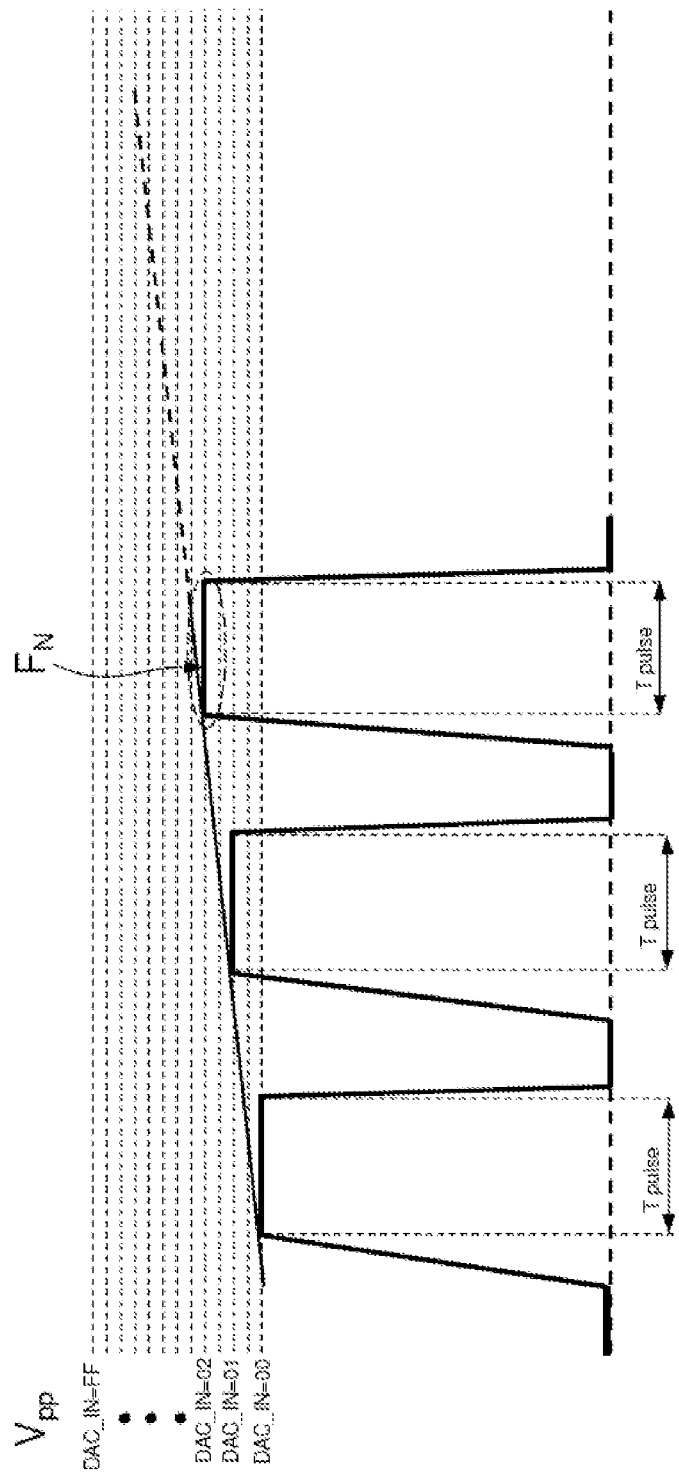
FIG. 3A show a plot of voltage pulses applied during an initial erase operation.

FIG. 3A show a plot of voltage pulses applied during an initial erase operation for a known approach.

The known approach illustrated in FIG. 3A includes increasing the value of the pulses until the level of the actual pulse of the bulk voltage Vpp reaches or exceeds the threshold for triggering of the FN tunneling effect and recording information about the voltage level (which may include parameters defining the voltage level) that successfully triggered the FN tunneling effect. The information is accessed at the outset of a following erase procedure so a first pulse for the following erase procedure can be equal to the last pulse from a preceding erase operation, which was sufficient in the prior cycle to trigger the FN tunneling effect.

Consistent with this approach, in the example shown in FIG. 3A, three pulses are used to successfully perform the erase procedure. Erase verifications carried out between the supply of the first and second pulses did not show that an effective erase operation had been successfully performed. So, additional voltage pulses at an increased voltage level were performed. An erase verification carried out after the third pulse determined that the memory cells 1 of the desired set (for example, a page or a sector) had been effectively erased and that the voltage level of the pulse triggered a FN tunneling effect for that erase operation. Information associated to the actual biasing configuration, for example the actual level of the bulk voltage Vpp, or a digital representation, is then stored for use in a subsequent erase procedure. The biasing configuration may also comprise data to be supplied to a DAC that provides biasing like depicted in FIG. 3A and FIG. 3B by the dashed horizontal lines. A first voltage level may correspond to a DAC-IN—00, a second voltage level may correspond to a DAC_IN=01, and so on.

Figure 3B:
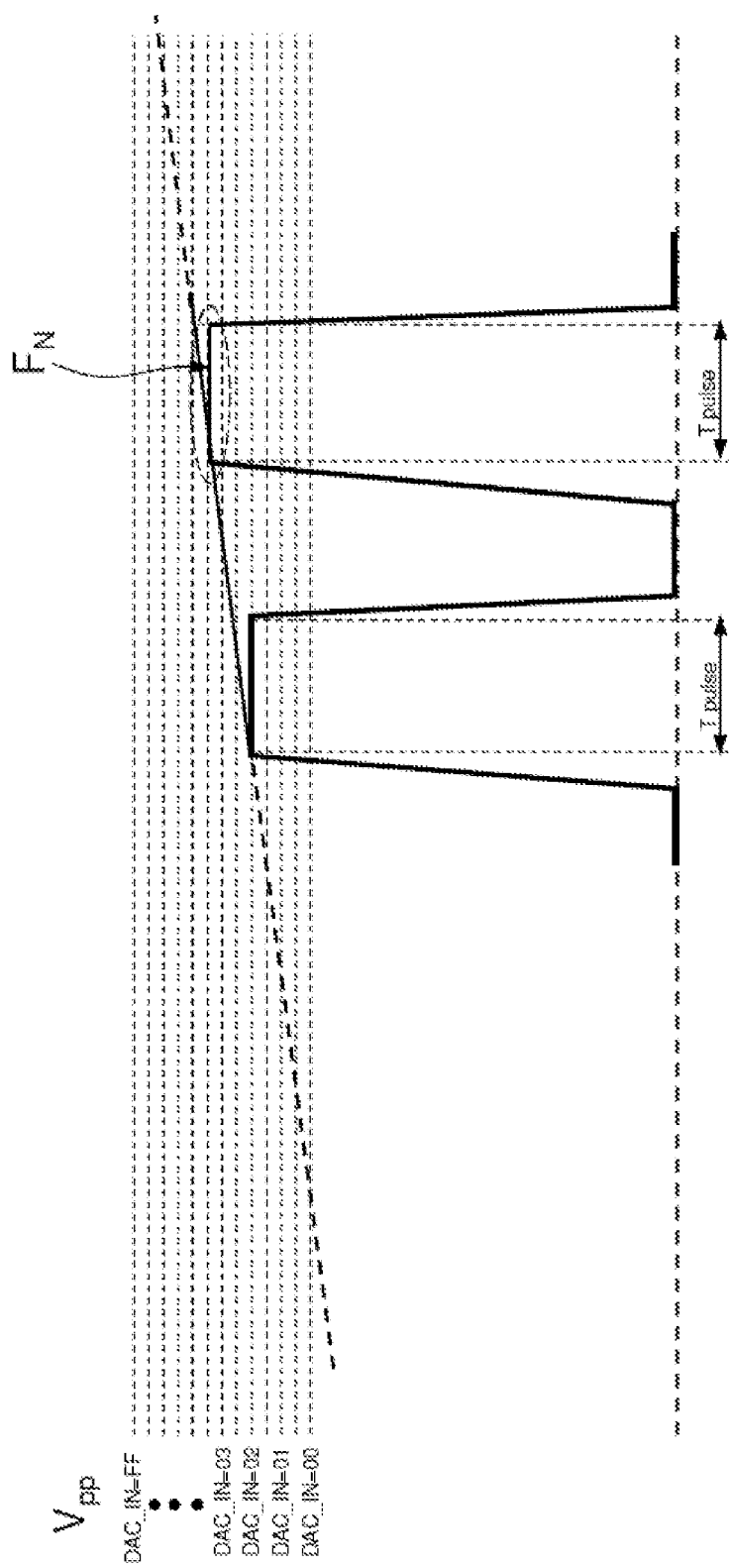
FIG. 3B shows a plot of voltage pulses applied during a subsequent erase operation.

FIG. 3B shows a plot of voltage pulses applied during a subsequent erase operation for a known approach.

A subsequent erase operation may be performed on the same set of memory cells 1. The previously stored information about the previous biasing configuration may be used to determine the biasing configuration of the first step of the iterative process of the subsequent erase operation according to the information retrieved. In the example in FIG. 3B, the level of the first pulse of the bulk voltage Vpp may be the value stored (for which the erase operation previously performed was successful). If the first pulse was unsuccessful in the new erase operation, an application of a second pulse may be performed to successfully execute the erase operation (the level of which will be stored by the control circuit 14 for future memory operations).

FIG. 4A illustrates a distribution of threshold voltages for a plurality of memory cells of a set of memory cells before and after a single pulse has been applied to the memory cells 1 for an erase operation using a known method.

FIG. 4A depicts two curves representing the distribution of the threshold voltages of a plurality of memory cells 1. The first curve 402A represents the distribution of the threshold voltages before a single pulse of an erase operation has been performed. And, the second curve 404A represents the distribution of the threshold voltage after a single pulse of the erase operation has been performed. To determine whether an erase operation has been executed successfully, an erase-verify test may be performed where the distribution of the threshold voltages of the plurality of memory cells 1 after the application of the single pulse is compared with an erase-verify voltage 406.

The first curve 402A is greater than the erase-verify voltage 406. The single voltage pulse of the erase operation shifts the distribution of threshold voltages of the memory cells 1 to the second curve 404B. The second curve 404A is less than the erase-verify voltage 406 so the erase operation was successfully executed. No second pulse is needed. And, the configuration of the pulse of the erase operation may be saved for a subsequent erase operation. But, as more erase operations are performed, the distribution of threshold voltages of the memory cells 1 will become less sensitive to a voltage pulse at the level that was previously successful. The distribution of threshold voltages of the memory cells will shift less and less. Eventually, the voltage level previously used to successfully execute the previous erase operation will not move the distribution of threshold voltages of the memory cells 1 far enough to successfully perform the erase operation for a subsequent erase operation. In such a situation, the voltage level must be increased, and a second pulse must be applied to complete the erase operation. And, the new voltage level may be stored for future erase operations.

FIG. 4B illustrates a distribution of threshold voltages for a plurality of memory cells of a set of memory cells before and after a single pulse of a subsequent erase operation using a known method.

The first curve 402B represents the distribution of threshold voltages of the memory cells 1 before a single voltage pulse of a subsequent erase operation. Once again, before the erase operation, the first curve 402B is greater than an erase-verify voltage. But, application of a voltage pulse at the level previously used for the erase operation depicted in FIG. 4A no longer moves the distribution of threshold voltages of the memory cells 1 far enough to clear the erase-verify voltage 406. The voltage pulse at the previous level now only shifts the distribution of threshold voltages of the memory cells 1 from the first curve 402B to a second curve 404B. Only a portion of the second curve 404B is less than the erase-verify voltage 406. So, the first voltage pulse has failed to successfully execute the erase operation.

Figure 4C:
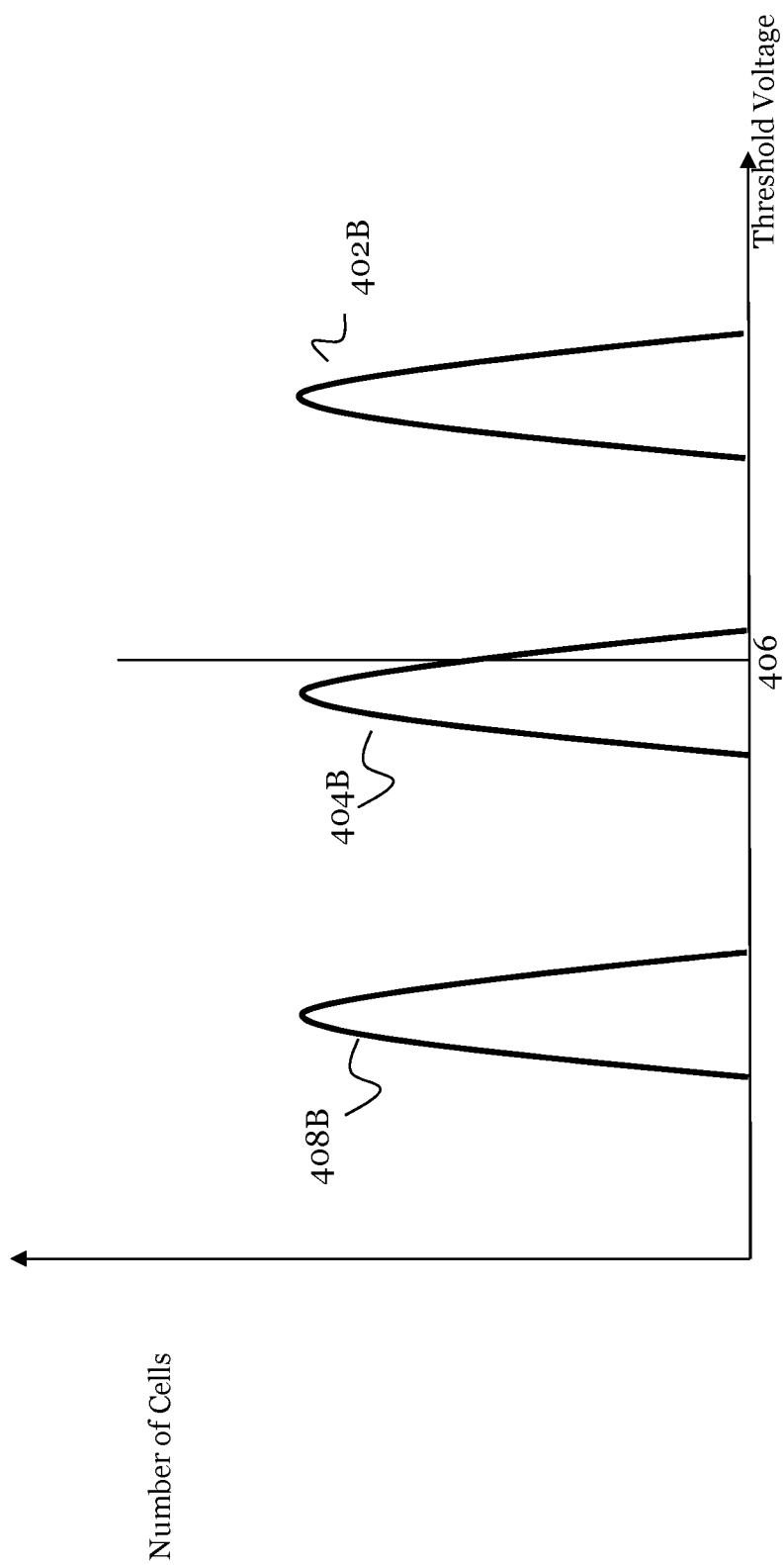
FIG. 4C illustrates a distribution of threshold voltages for a plurality of memory cells of a set of memory cells before and after a second pulse of a subsequent erase operation using a known method requiring a second voltage pulse.

FIG. 4C illustrates a distribution of threshold voltages for a plurality of memory cells of a set of memory cells before and after a second pulse of a subsequent erase operation.

A second voltage pulse at an elevated level may be required to complete the erase operation. FIG. 4C illustrates the distribution of the threshold voltages of the memory cells 1 after a second pulse with a third curve 408B. After the second pulse, the distribution of the threshold voltages of the memory cells has been shifted from the second curve 404B to the third curve 408B, which is entirely below the erase-verify voltage 406. The voltage used for the second pulse (or parameters defining the voltage level) may be stored so a future operation can begin with an initial pulse at the voltage level used for the successful completion of the erase operation.

Known wear leveling techniques are used to increase the lifetime of non-volatile memory devices and compensate for the degradation the memory cells experience during the lifetime of a memory device. Some known approaches include, but are not limited to, dynamic wear leveling and static wear leveling. Known approaches utilize a table to translate a host address (like a logical block address) into a physical address of a set of memory cells (like a physical block address). The table is used as a mapping table and has to be managed and maintained as the memory sets corresponding to the physical block address are cycled.

Figure 5A:
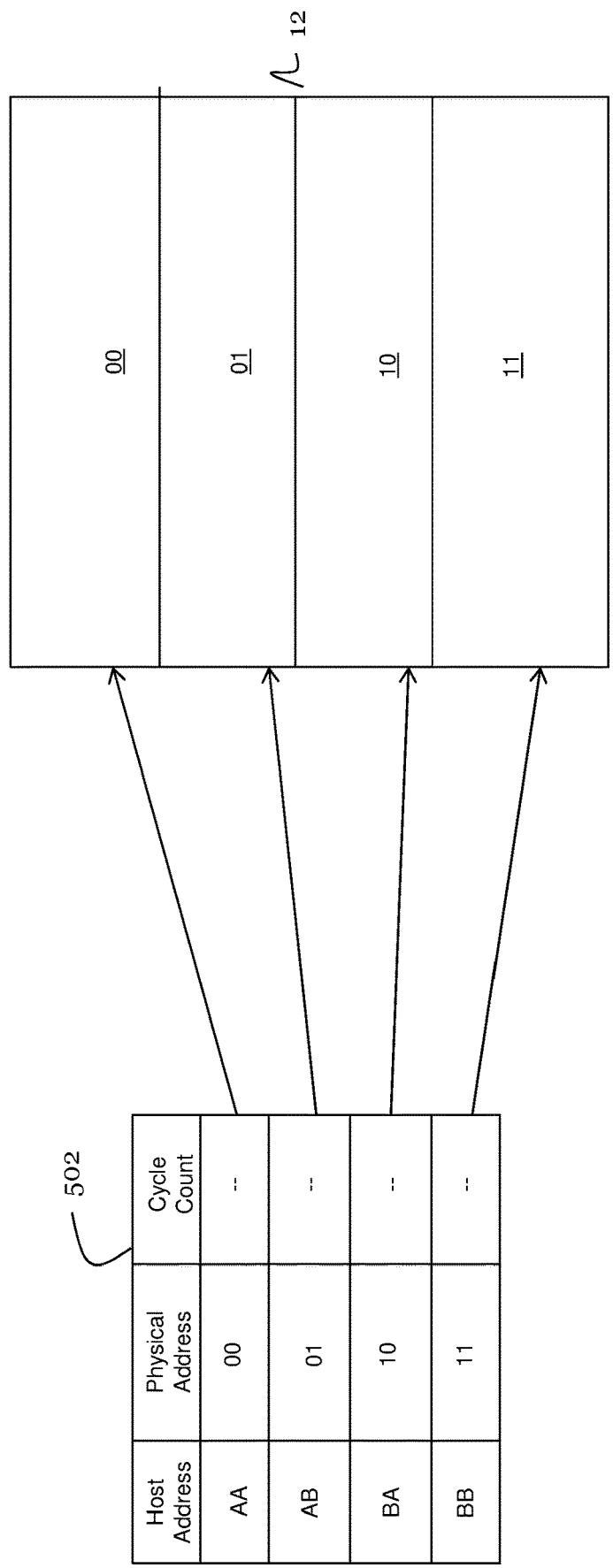
FIG. 5A, FIGS. 5B, and 5C illustrate a known method for allocating sets of non-volatile memory for wear leveling.
Figure 5B:
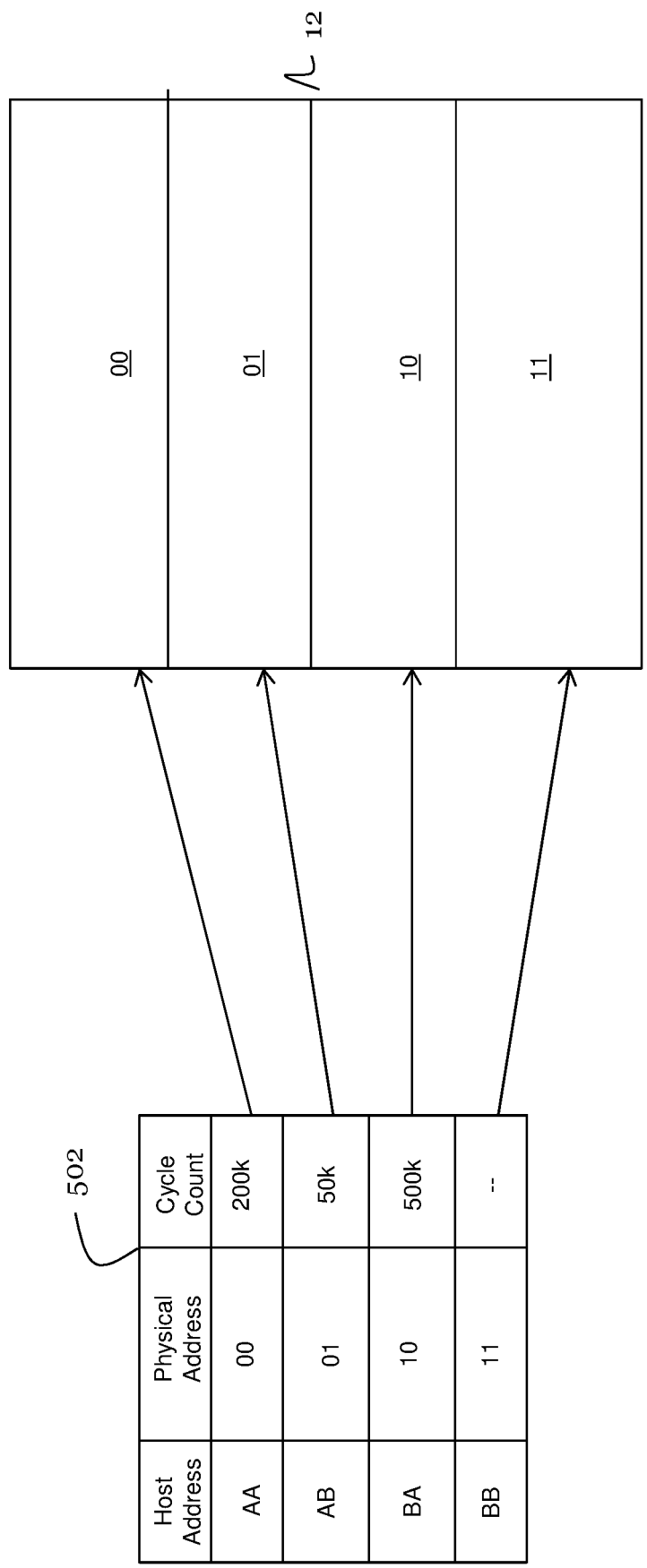
Figure 5C:
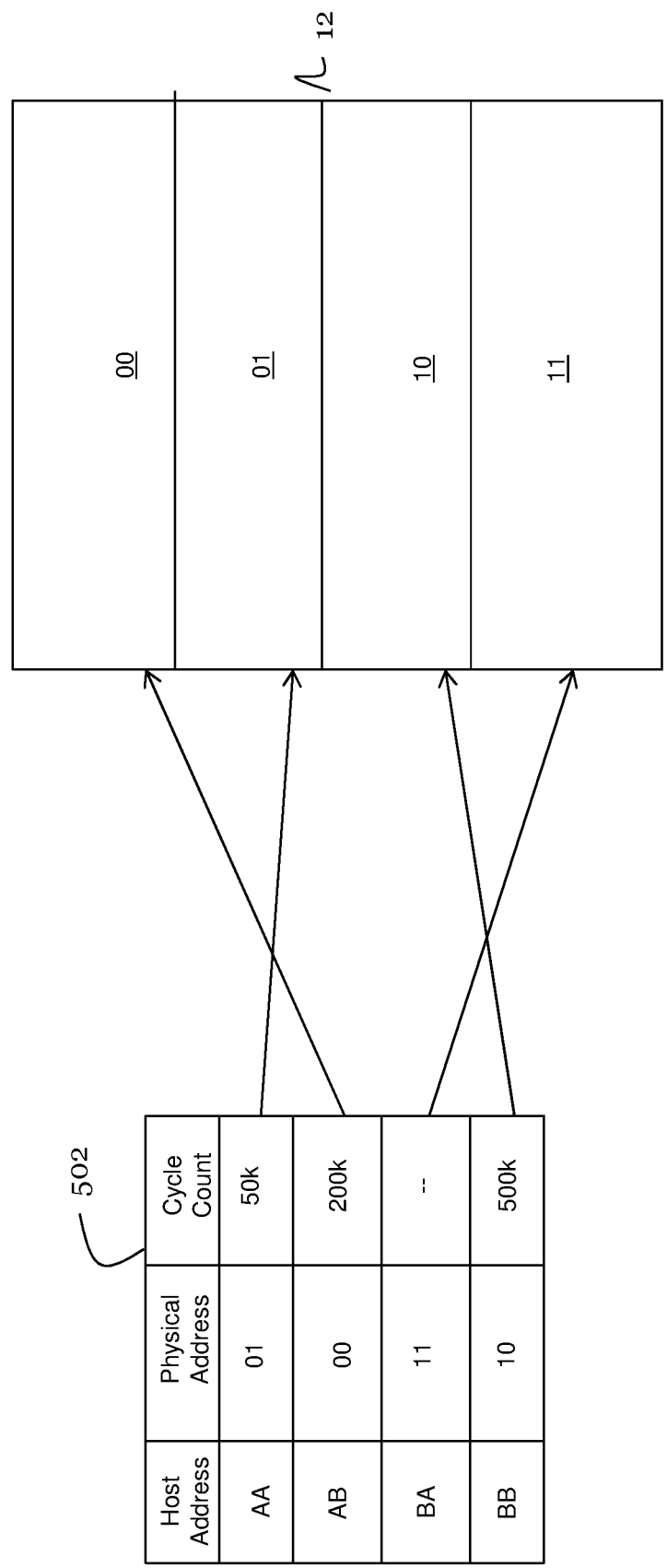

FIG. 5A, FIGS. 5B, and 5C illustrate a known method for allocating sets of non-volatile memory for wear leveling.

FIG. 5A depicts an initial configuration of a lookup table 502 associating host addresses with physical addresses corresponding to sets of non-volatile memory cells. A memory array 12 is divided into a first set of non-volatile memory cells 00, a second set of non-volatile memory cells 01, a third set of non-volatile memory cells 10, and a fourth set of non-volatile memory cells 11. A first column of the lookup table 502 lists a first host address AA, a second host address AB, a third host address BA, and a fourth host address BB. The first host address AA is arranged side by side with a physical address for an associated set of non-volatile memory cells, in this case the first set of non-volatile memory cells 00. The second host address AB, the third host address BA, and the fourth host address BB are similarly arranged in relation to physical addresses corresponding to the second set of non-volatile memory cells 01, the third set of non-volatile memory cells 10, and the fourth set of non-volatile memory cells 11. A third column shows the count cycle for each set of non-volatile memory cells.

Instructions to perform a memory operation received from a host device identifying the first host address AA are compared with the lookup table 502 to determine the physical address of the associated set of non-volatile memory cells, in this case the first set of non-volatile memory cells 00, so that the memory operation may be performed on the first set of non-volatile memory cells 00. Instructions to perform memory operations identifying other hosts addresses are also compared with the lookup table 502 to determine where to perform a memory operation depending on the associations between the host addresses and the physical addresses defined by the lookup table 502. The associations between the lookup table 502 and the physical sets of non-volatile memory are also denoted in FIG. 5A, FIG. 5B, and FIG. 5c by arrows pointing from the lookup table to the memory array 12. As the sets of non-volatile memory cells are cycled, the corresponding cycle counts are incremented to approximate the wear on the sets of non-volatile memory cells.

FIG. 5B depicts the lookup table 502 still in an initial configuration if no redistribution has occurred after a number of cycles. In the example shown in FIG. 5B the various sets of non-volatile memory cells have been unevenly cycled. The third set of non-volatile memory cells 10 has been cycled 500 hundred thousand times while the fourth set of non-volatile memory cells 11 has not been cycled at all. This uneven usage can cause the third set of non-volatile memory cells 10 to stop functioning while the fourth set of non-volatile memory cells 11 has barely been used. To extend the life of the non-volatile memory device, the sets of non-volatile memory cells can be redistributed.

FIG. 5C depicts the lookup table 502 after the sets of non-volatile memory cells have been redistributed so they are associated with different host addresses. The first set of non-volatile memory cells 00 is now associated with second host address AB. The second set of non-volatile memory cells 01 is now associated with first host address AA. Instructions to perform a memory operation received from a host device identifying the first host address AA will now be performed on the second set of non-volatile memory cells 01. Instructions identifying the third host address BA will now be performed on the fourth set of non-volatile memory cell 11.

However, sets of non-volatile memory of a non-volatile memory device may need to be cycled many thousands of times. And, a single non-volatile memory device may have many sets of non-volatile memory cells. This may require a non-volatile memory device to reserve more memory than desirable for keeping count of all the sets of non-volatile memory devices.

This burden may be ceased by tracking the voltage used to perform erase operations rather than counting individual cycles. As discussed with reference to the preceding figures of this disclosure, the voltage level needed to induce an FN tunneling effect in a memory cell increases as the memory cell is used. Eventually, a non-volatile memory device may fail when the voltage level needed to induce the FN tunneling effect become greater than the non-volatile memory device can accommodate. The voltage level needed to perform erase operations is more directly tied to the wear on a memory cell than the cycle count so it may replace the cycle count as a metric used to redistribute sets of non-volatile memory cells in a lookup table. This may also save memory resources because the voltage level for an erase operation need not be increased for each cycle.

Figure 6A:
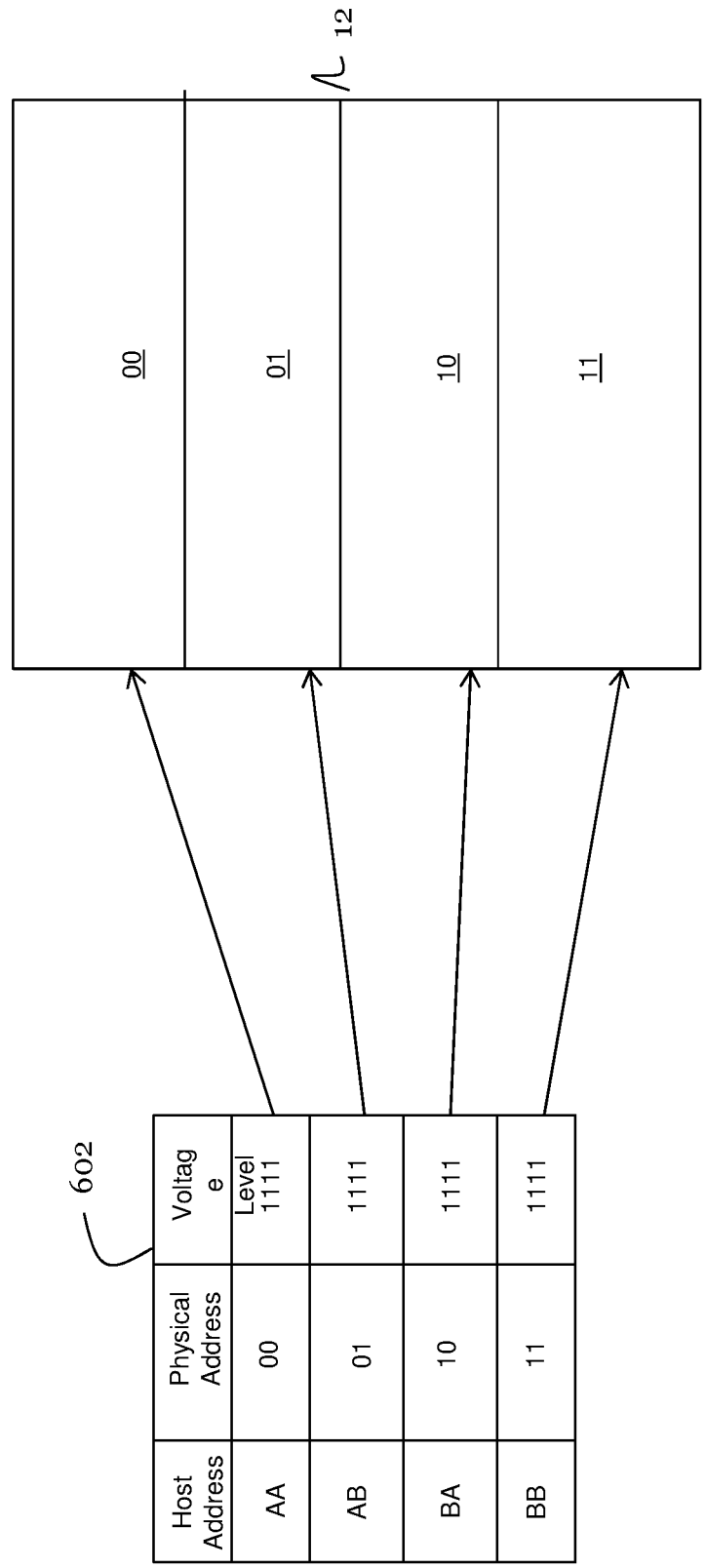
FIG. 6A, FIGS. 6B, and 6C illustrate a method for allocating sets of non-volatile memory for wear leveling.
Figure 6B:
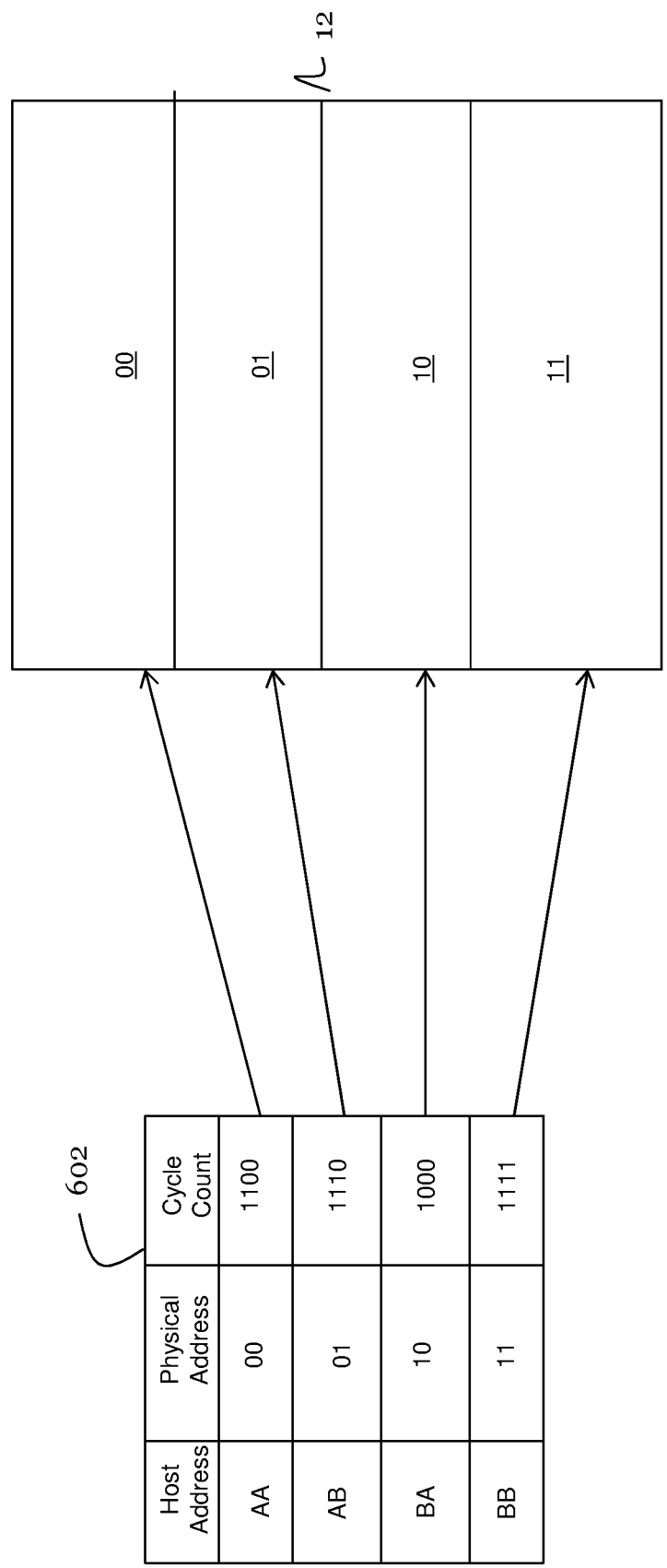
Figure 6C:
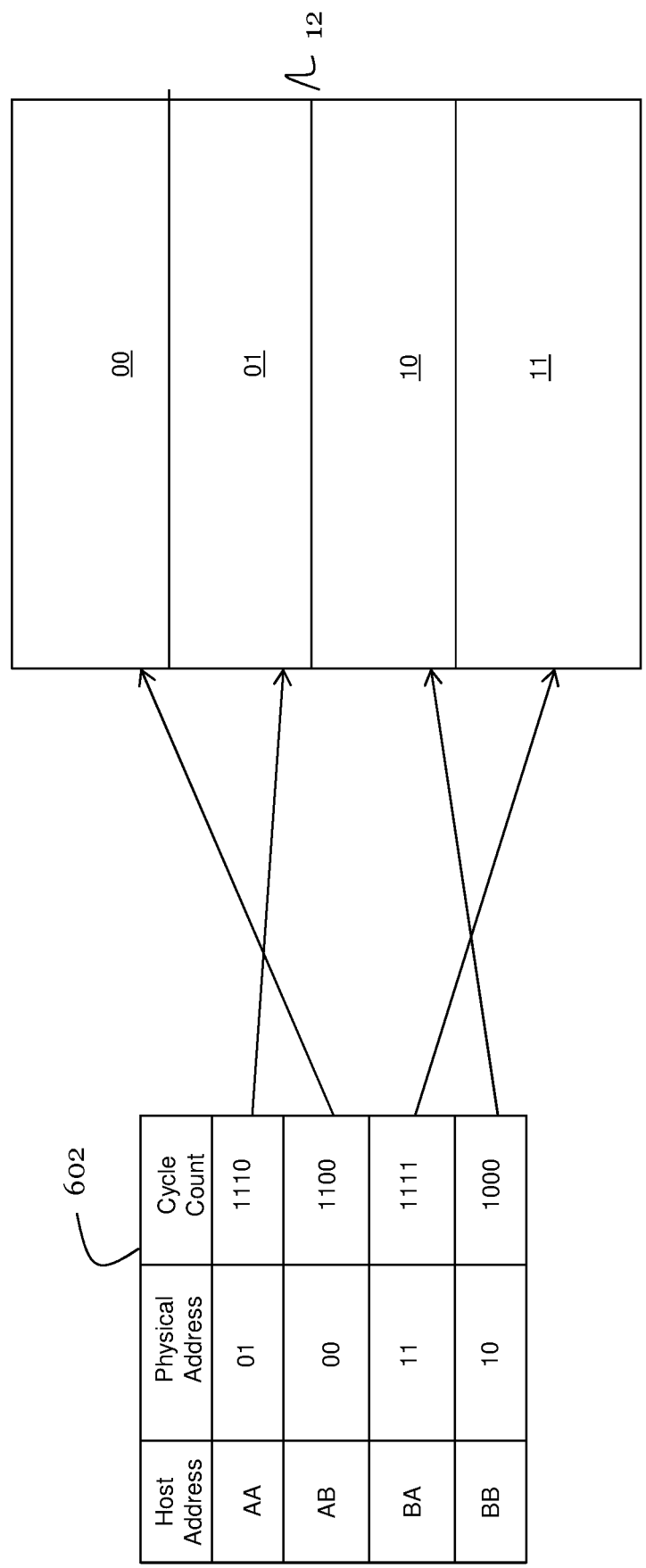

FIG. 6A, FIGS. 6B, and 6C illustrate a method for allocating sets of non-volatile memory for wear leveling.

FIG. 6A depicts an initial configuration of a lookup table 602 associating host addresses with physical addresses corresponding to sets of non-volatile memory cells. Like the lookup table 502 in FIG. 5A, FIG. 5B, and FIG. 5C, a first column of the lookup table 602 lists a first host address AA, a second host address AB, a third host address BA, and a fourth host address BB. The host addresses may be associated with physical addresses in the lookup table 602. In FIGS. 6A, 6B, and 6C, the first host address AA is arranged side by side with a physical address of an associated set of non-volatile memory cells. In FIG. 6A, the first set of non-volatile memory cells 00. The second host address AB, the third host address BA, and the fourth host address BB are similarly arranged with in relation to physical addresses corresponding to the second set of non-volatile memory cells 01, the third set of non-volatile memory cells 10, and the fourth set of non-volatile memory cells 11. It should be noted that the lookup table 602 is presented for illustrative purposes and should not be considered to limit applications of this disclosure by the size or organization of the lookup table 602.

A third column displays the voltage level used for an erase operation of the sets of non-volatile memory cells, or that will be used for future erase operations. The third column may, or may not, be part of the lookup table 602. In various embodiments, the voltage levels for erase operations may be stored elsewhere and retrieved when needed so the associations between the host addresses and physical addresses may be redistributed. In various embodiments, the voltage levels corresponding to sets of non-volatile memory cells may be stored in dedicated memory areas for the corresponding sets of non-volatile memory cells. In FIG. 6A, the voltage levels depicted for each set of non-volatile memory cells may represent an initial configuration. This may correspond to the voltage level applied at the beginning of the lifecycle of a memory device before memory cell degradation. In FIG. 6A, this voltage level is denoted by bit number "1111." And, an increase in the voltage level for performing erase operations may be represented by switching one bit to a "0." For example, the bit number "1110" may represent a voltage level that has been increased once over the level applied at the beginning of the life cycle of a memory device, and the bit number "1000" may represent a voltage level that has been increased three times. Various embodiments may comprise more or less bits. More bits may allow more voltage levels. And, it will be appreciated that voltage levels may be represented in many other ways in various embodiments.

Instructions to perform a memory operation received from a host device identifying the first host address AA may be compared with the lookup table 602 to determine the physical address of the associated set of non-volatile memory cells. Using the table in FIG. 6A, the instructions identified by host address AA will direct execution of a memory operation on the first set of non-volatile memory cells 00. Instructions to perform memory operations identifying other host addresses may also compared with the lookup table 602 to determine where to perform a memory operation depending on the associations between the host addresses and the physical addresses defined by the lookup table 602. The associations between the lookup table 602 and the physical sets of non-volatile memory are also denoted in FIG. 6A, FIG. 6B, and FIG. 6C by arrows pointing to from the lookup table to the memory array 12.

As the sets of non-volatile memory cells are cycled, the voltage level to perform the erase operations on the sets of non-volatile memory devices will increase. Information about the voltage level used to perform non-volatile erase operations may be stored, for example in dedicated memory areas corresponding to the sets of non-volatile memory, or sensed, so the lookup table 602 may be re-arranged for wear-leveling purposes.

FIG. 6B depicts the lookup table 602 after some cycling and increases in the voltage levels used to perform erase operations has increased for some of the sets of non-volatile memory cells, but without redistribution of the associations of the host addresses and the physical addresses. The voltage level is now represented by "1000" for the third set of non-volatile memory cells 10 while the voltage level for the fourth set of non-volatile memory cells 11 remains at the initial level "111" and the voltage levels for the remaining sets have been changed as depicted. The sets of non-volatile memory cells may be re-allocated to allow more even wear.

FIG. 6C depicts the lookup table 602 after the sets of non-volatile memory cells have been redistributed are associated with different host addresses. The first set of non-volatile memory cells 00 is now associated with second host address AB. The second set of non-volatile memory cells 01 is now associated with first host address AA. Instructions to perform a memory operation received from a host device identifying the first host address AA will now be performed on the second set of non-volatile memory cells 01. Instructions identifying the third host address BA will now be performed on the fourth set of non-volatile memory cell 11. The remaining associations have been redistributed as indicated to allow for even wear of the sets of the non-volatile memory cells.

Allocation and redistribution of sets of memory cells in the lookup table 602 may, or may not, take place for all the sets of memory cells at the same time. The reallocation of the sets of non-volatile memory cells (or their corresponding physical block addresses) to host addresses may be accomplished in a number of ways in various embodiments. In various embodiments, allocation may occur as needed. Once a set of memory cells associated with a host address has been cycled too much relative to other memory sets, a different memory set with less wear (e.g., using erase voltage as a metric) may be associated with the host address in the lookup table 602. The contents of the first set of memory cells may also be transferred to the replacement set of memory cells so the memory states are maintained. Various embodiments may utilize different redistribution schemes to achieve even wear (e.g., using erase voltage as a metric) including, but not limited to, swapping the host addresses associated with most worn and least worn memory sets. In various embodiments, associations may be updated periodically, triggered by changes in voltage levels, or updated due to continuous monitoring.

Figure 7:
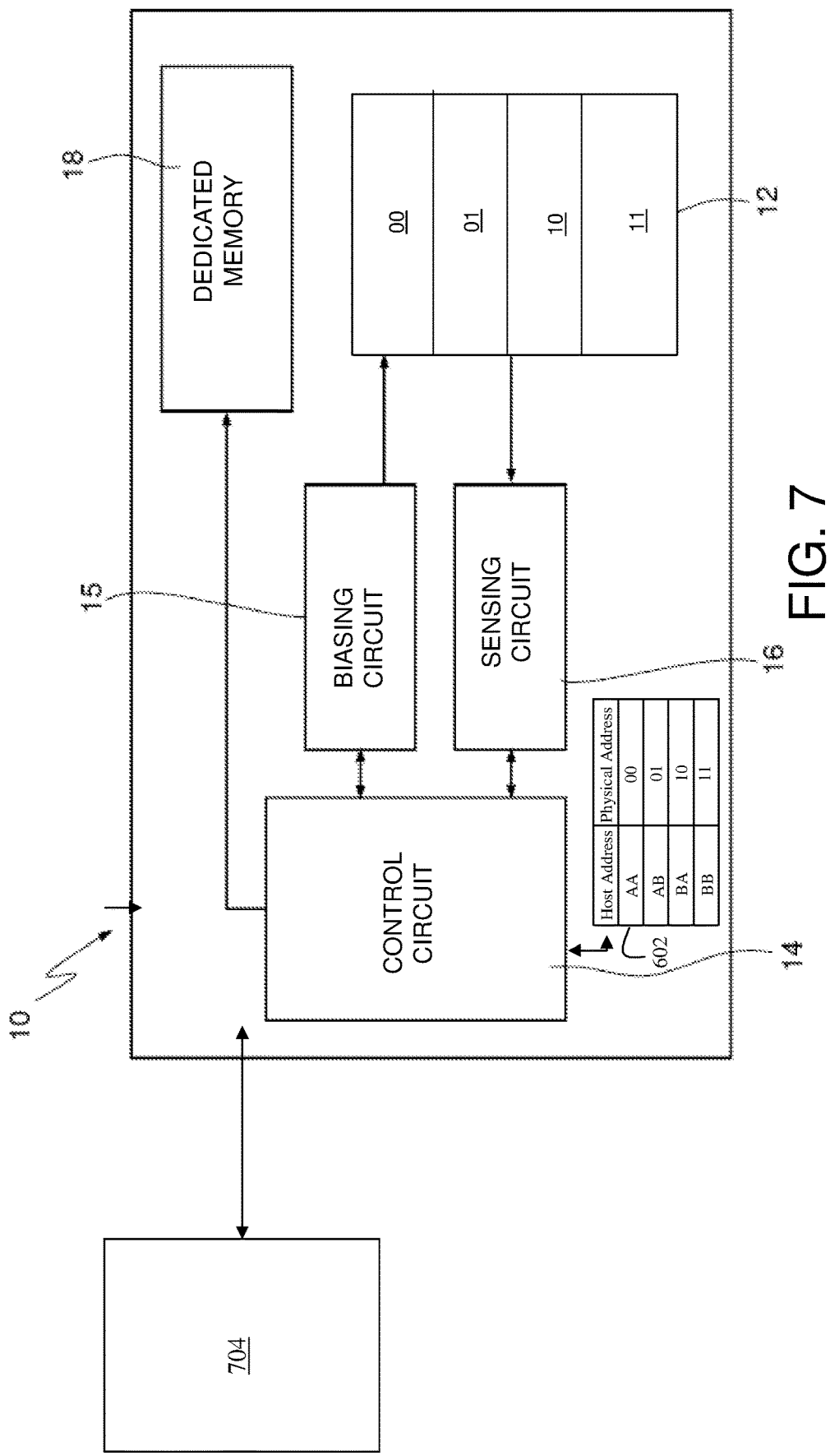
FIG. 7 depicts a schematic of a non-volatile memory device.

FIG. 7 depicts a schematic of a memory device 13 of various embodiments.

In various embodiments, the memory device 13, may comprise a non-volatile memory device, for example, flash or page-flash type. The memory device 13 may comprise a memory array 12. The memory array 12 may comprise a first set of non-volatile memory cells 00, a second set of non-volatile memory cells 01, a third set of non-volatile memory cells 10, and a fourth set of non-volatile memory cells 11. As will be appreciated, the number of sets of non-volatile memory cells may vary in various embodiments. Memory cells of the sets of non-volatile memory cells may comprise memory cells of the floating-gate type (for example, as described with reference to FIG. 1). The memory cells 1 may be arranged in rows (word lines) and columns (bit lines) and operatively grouped together in sets (for example, sectors, blocks, or pages). The sets of non-volatile memory cells may comprise different number of memory cells 1 in different embodiments. In various embodiments, each memory cell 1 of a set of memory cells may comprise a floating-gate type. The memory cells 1 may be configured so they lose information stored in them when a threshold voltage of the non-volatile memory cell is less than an erase-verify voltage. This may be accomplished by an erase operation applying a voltage between a control region and bulk region of a memory cell as described with reference to FIG. 1.

Various memory operations of the memory device 13 may be performed on all the memory cells 1 of a set simultaneously. For example, an erase operation for erasing the information stored in the memory cells 1 may be carried out in the memory device 13 simultaneously for all the memory cells 1 belonging to a set 12A (for example, sector or page).

The memory device 13 may further comprises a control circuit 14, which in various embodiments may comprise a microprocessor or microcontroller, which is operatively associated to the memory array 12 and is designed to control operation thereof and in particular to control execution of the memory operations, amongst which, for example, may comprise the erase operation, and erase-verify operation.

The control circuit 14 may also control the operation of a lookup table 602. In various embodiments, the lookup table 602 may be stored in the memory array 12. In various embodiments, the lookup table 602 may be stored in another location. The lookup table 602 may comprise a column with fields populated with host addresses such as Logical Block Addresses (LBAs). Host addresses may include a first host address AA, a second host address AB, a third host address BA, and a fourth host address BB. As can be appreciated, the host addresses themselves may take different forms in different embodiments. And, the lookup table 602 may comprise more or less host addresses.

The lookup table 602 may also comprise a column with fields containing physical addresses that identify sets of non-volatile memory cells. In the example provided in FIG. 7 the physical addresses in the lookup table are identical to the corresponding set of non-volatile memory cells. However, this may not be true in various embodiments and different values may be used for the physical addresses. The lookup table 602 may comprise any number of physical addresses depending on the design of the memory device 13.

The fields of the lookup table containing host addresses may be associated with fields that contain physical addresses. For example the first host address AA may be associated with the physical address corresponding to the first set of non-volatile memory cells 00, the second host address AB may be associated with the physical address corresponding to the second set of non-volatile memory cells 01, and so on. In other words, the host addresses of the lookup table 602 may be mapped to physical addresses to allow memory operations identified by the host addresses to be performed on the set of non-volatile memory cells corresponding to the physical addresses.

For example, the memory device 13 may be in communication with a host device 704. Instructions received from the host device 704 may identify a host address to perform a memory operation on the first host address AA. The control circuit 14 may consult the lookup table 602 to determine that the first host address AA is associated with the physical address identifying the first set of non-volatile memory locations 00 and direct the execution of the memory operation on the first set of non-volatile memory locations 00.

The control circuit 14 may also be configured to update the contents of the lookup table 602 to disassociate a set of nonvolatile memory locations from a host address and associate the set on non-volatile memory cells to another host address. For example, the control circuit may disassociate the first set of non-volatile memory cells 00 from the first host address AA and associate the first set of non-volatile memory cells 00 with the second host address BA. Instructions received from the host device 704 identifying the second host address BA, will then be executed on the first set of non-volatile memory cells 00.

The memory device 13 may further comprise a biasing circuit 15, in communication with and controlled by the control circuit 14. The biasing circuit 15 may provide appropriate biasing signals to the memory cells 1 of the memory array 12 during the memory operations (for example, the aforesaid pulsed bulk voltage Vpp, during the erase operation). The biasing circuit 15 may be configured to apply an erase voltage to the memory array 12 to perform an erase operation on a selected set of memory cells 1. This may erase a data set stored on the selected set of non-volatile memory cells. The selected set may be selected depending on instructions received by the control circuit that identify which set should be erased. This may be performed by translating a host address in the instructions into a physical address that identifies the selected set of non-volatile memory cells. The erase voltage may be applied simultaneously to more than one set of memory cells at a time in various embodiments. In various embodiments, the biasing circuit may comprise a digital to analog convert ("DAC") that receives a control signal DAC_IN from the control circuit. The control signal DAC-IN may determine the voltage level for erase operations. The control signal DAC-IN may also determine the voltage level for read operation. The control signal DAC-IN may determine the voltage level for test operations.

The biasing circuit may be configured to apply an erase voltage to each memory cell 1 of a set 12A of memory cells between a control-gate region 8 and the bulk region 2 of each memory cell 1 of a set of memory cells for an erase operation being performed on the set 12A of memory cells 1. The erase voltage may be varied by varying the voltage applied to the control-gate region 8, the bulk region 2, or both. The biasing circuit 15 may be configured to apply a control voltage to the control gate-gate region of each memory cell 1 of a set 12A of memory cells to perform an erase-verify operation, a read operation, or a test operation.

The memory device 13 may further comprise a sensing circuit 16, which is also in communication with the control circuit 14. The sensing circuit 16 may detect the conduction characteristics of memory cells 1 (for example, for comparing a control voltage with a threshold voltage of a memory cell 1 or set of memory cells 1 during the erase-verify operations, erase-verify operations, or both).

The conduction characteristic of a memory cell 1 may indicate whether the threshold voltage of the memory cell 1 is less than a control voltage applied to the control-gate region 8 of the memory cell 1. This may be used in various embodiments during an erase-verify operation to determine whether an erase operation has been successful In various embodiments, the sensing circuit 16 may comprise a sense amplifier that detects current passing through a channel formed between the source region 4 and drain region 5 of a memory cell when an appropriate voltage is applied to the control-gate region 8. The area where the channel forms in a memory cell 1 is denoted in FIG. 1 by 17.

The memory device 13 may comprise a dedicated memory location 18 managed by, and in communication with, the control circuit 14. The dedicated memory location 18, may comprise a plurality of memory cells 1. In various embodiments, the dedicated memory location 18 may not be accessible to the user of the memory device 13 for memory operations. Information of the configuration of the memory device 13—like the voltage level of successful erase voltages on corresponding memory sets—may be stored in this dedicated memory location 18. The dedicated memory location 18, in various embodiments, may be part of the memory array 12 that cannot be accessed by a user.

Figure 8:
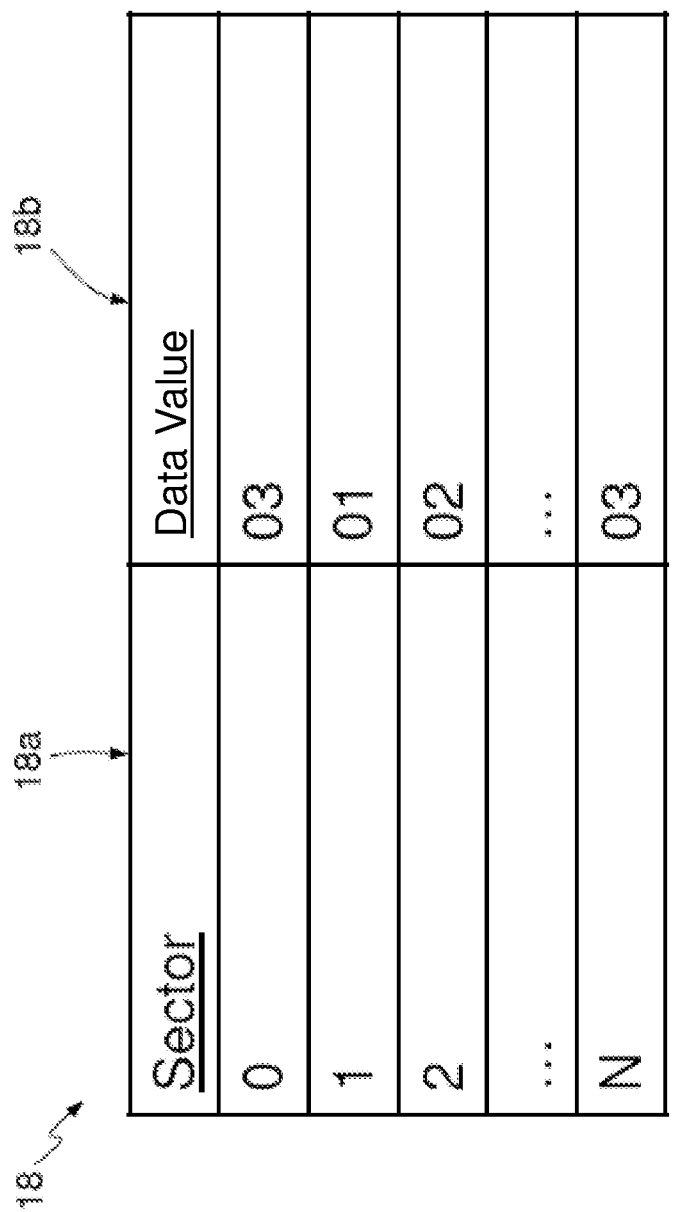
FIG. 8 depicts an embodiment of a dedicated memory location.

FIG. 8 depicts an embodiment of a dedicated memory location.

The control circuit 14 may be configured to retrieve data values from the dedicated memory location 18. As illustrated schematically in FIG. 8, a dedicated memory location 18 may comprise a look-up table (LUT) having a first column of fields 18a, "Sector", containing a reference associated to a sector (or page, set, or other type of group) of memory cells 1. In various embodiments the dedicated memory location 18 may comprise a column of fields 18b, labeled "Data Value", in which, that may store the voltage level used for the memory operations (for example, the last level of the bulk voltage Vpp that was used successfully for carrying out an erase operation, the digital value of the corresponding digital control signal DAC_IN delivered to a DAC of the biasing circuit 15 for an erase operation or a future erase operation). The fields of the "Data Value" column may comprise voltage level indicators configured to store data values indicating a voltage used to perform an erase operation on a set of non-volatile memory cells of the memory array 12 corresponding sets of non-volatile memory cells.

In various embodiments, the data values may be retrieved by the control circuit 14 to update the lookup table 602 as described with reference to FIG. 6A, FIG. 6B, and FIG. 6C. The memory device 13 may be configured to receive instructions from a host device 704 that identify a host address to perform a memory operation and the control circuit 14 is configured to use the lookup table to perform the memory operation on the appropriate set of non-volatile memory cells.

In various embodiments, the data values may also be retrieved by the control circuit to set the level of an initial pulse of an erase operation as described in reference to FIG. 3A and FIG. 3B. The data value stored in a second field 18B may comprise a variety of forms.

The control circuit 14 may be configured: to perform an erase operation by retrieving a data value corresponding to a set of non-volatile memory cells from the dedicated memory location 18 to instruct the biasing circuit 15 to provide an erase voltage to the set of non-volatile memory cells, the erase voltage being determined by the data value; and to perform an erase-verify operation by applying an erase-verify voltage to the set of non-volatile memory cells and update the data value corresponding to the set of non-volatile memory cells depending on the erase-verify operation. The erase-verify voltage may be applied to a control gate of the cells of the set of non-volatile memory cells to determine whether the threshold voltage of the cells is less than the erase-verify voltage by sensing the conduction characteristics of the cells of the non-volatile memory cells when the test voltage is applied.

The data values of the dedicated memory location 18 may be updated by the control circuit 14 as the voltage levels for performing erase operations increase. In various embodiments, different approaches may be utilized to determine the value of the voltage level used to perform an erase operation. As described with reference to FIGS. 2A and 2B, in some embodiments, voltage pulses may be iteratively increased until an erase-verify operation confirms that the erase operation was successful. The voltage level of the last pulse for a set of non-volatile memory cells may be stored in the dedicated memory location 18. In various embodiments, like those described with reference to FIGS. 3A and 3B, the voltage level is stored for use to set the voltage level for future erase operations and updated when erase-verify operations determine that it is no longer high enough to erase the corresponding set of non-volatile memory cells. This data may be stored in the dedicated memory location 18 and retrieved to set the voltage level for future erase operations and for updating the lookup table 602. In various embodiments, the voltage level used for erase operations, and corresponding data values, may be updated anticipatorily before it has been used in an erase operation when it has been determined that a higher voltage level will be needed for a subsequent erase operation.

The data values in the dedicated memory may comprise different forms in different embodiments.

Figure 9A:
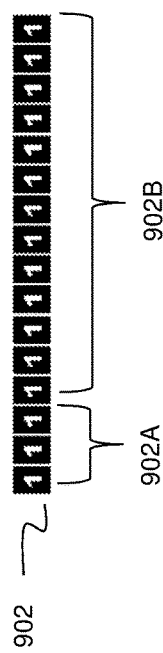
FIG. 9A depicts a 16-bit data value in an initial configuration.

FIG. 9A depicts a 16-bit data value in an initial configuration.

In various embodiments, the data value 902 may correspond to a value used for an erase voltage for an erase operation for a corresponding set of non-volatile memory cells. It may retrieved by the control circuit 14 to update the lookup table 602 where higher voltage levels are used as a metric for wear on a set of non-volatile memory cells. In various embodiments, it may also be retrieved by the control circuit 14 to set the value of a voltage applied to a set of non-volatile memory cells during for an erase operation. It may be preferable to vary the voltage applied to the control-gate region 8 of a memory cell, the voltage applied to the bulk region 2 of a memory cell, or both to alter an erase voltage for an erase operation. In some embodiments, a first section 902A, comprising the three most significant bits depicted in FIG. 9, may determine a voltage value to be applied to control-gate regions 8 of the memory cells 1 for an erase operation. A second section 902B, comprising the thirteen least significant bits depicted in FIG. 9, may correspond to a voltage value to be applied to the bulk region 2 of the memory cells 1 for an erase operation.

An initial setting of the data value 902 may correspond to an initial voltage level for an erase voltage for the first erase operation at the beginning of the life cycle of a memory device 13. The initial level may be determined during manufacturing or testing of the memory device 13. The initial value of the data value may comprise all "1"s, in various embodiments. However, it will be appreciated that the initial value can comprise any combination of digital values desired. The data value 902 may be changed by varying the bits of the data value 902. This may also change the level of an erase voltage based on the data value 902. The first section 902A, the second section 902B, or both may be changed to vary the level of the erase voltage. This value may also be used by the control circuit 14 as a proxy for wear on the memory cells so the lookup table 602 may be updated to for wear levelling.

Figure 9B:
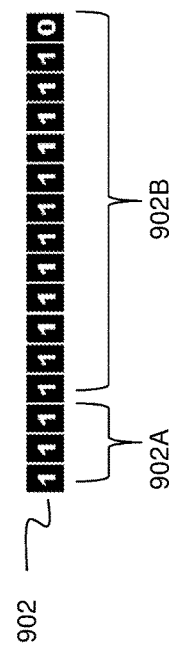
FIG. 9B depicts a 16-bit data value in an incremented configuration.

FIG. 9B depicts a 16-bit data value in an incremented configuration.

The data value 902 may be incremented by changing the value of the one of the bits of the data value 902. In FIG. 9B, the least significant bit of the second section 902B of the data value 902 has been switched from a "1" to a "0". This new configuration may be corresponded to an increased erase voltage level. In various embodiments, incremented voltage value at 902B may indicate an increased voltage level to be applied to the bulk region 2 of the memory cells 1 for an erase operation. Each possible value of the data value 902 may be corresponded to an erase voltage level. The values may also be corresponded to input values for a DAC, like depicted in FIG. 3A and FIG. 3B. In various embodiments, the bits of the data value 902 may only be changed once so a 16-bit data value would allow increments, each corresponding to different possible value for an erase voltage.

Figure 9C:
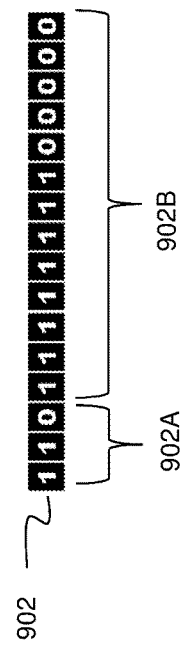
FIG. 9C depicts a 16-bit data value in an incremented configuration.

FIG. 9C depicts a 16-bit data value in an incremented configuration.

The least significant bit of the first section 902A has been incremented in FIG. 9C. This may correspond to a change in the value of the voltage to be applied at control-gate region 8 of a memory cell 1 during an erase operation. The five least significant bits of the second section 902B have also been incremented. The configuration of the data value 902 in FIG. 9c may correspond to six increments from the initial value of the data value 902 in FIG. 9A. It should be appreciated, however, that the data value 902 may be incremented in any way desired. In various embodiments, the data value may comprise more, or less, bits, it may have more or less sections, and the sections may be comprise different lengths.

Returning to FIG. 7, the control circuit 14 of the memory device may be configured to retrieve a data value 902, or multiple data values to update the lookup table 602 or determine how to allocate memory resources. The higher the voltage level reflected by the data value 902, the more wear on the set on non-volatile memory cells. The sets of non-volatile memory cells may be ranked according to their wear and allocated to host addresses so they are worn evenly. This may involve allocating low-wear sets of non-volatile memory to high usage host addresses in some embodiments. In various embodiments, this may involve allocating low wear sets of non-volatile memory cells when instructions from a host device request memory resources.

The control circuit 14 may also be configured to execute an erase operation after retrieving a data value 902 from the dedicated memory location 18 corresponding to a set of the memory array 12. Depending on the data value 902, the control circuit 14 may deliver a control signal to the biasing circuit 15. In various embodiments, the control signal may comprise a DAC_IN for a DAC of the biasing circuit. The biasing circuit 15, under the direction of the control circuit 14 may then apply an erase voltage to the memory cells 1 of the set 12A of the memory selected for the erase operation.

The control circuit 14 may also be configured to perform an erase-verify operation to determine if the distribution of the threshold voltages of the memory cells 1 of a selected set of memory cells is less than an erase-verify voltage. This may be accomplished by controlling the biasing circuit 15 to apply a control voltage at a level equal to an ease-verify voltage to the memory cells 1 of a set of the memory array 12. The sensing circuit 16 may detect a conduction characteristic of the memory cells 1 of the set of non-volatile memory cells of the memory array 12, which may be used to determine whether the distribution of the threshold voltages of the memory cells 1 is greater than or less than an erase-verify voltage. The set of non-volatile memory cells may be determined to have passed the test operation if it is determined that all, a predetermined number, or percentage of the threshold voltages of the memory cells has been moved enough to clear the erase-verify voltage. If a set of non-volatile memory cells passes the erase-verify operation, the voltage level of the erase voltage may not need to be increased. If a set of non-volatile memory cells does not pass the erase-verify operation, the data value 902 may incremented and another voltage pulse may be applied to the set of non-volatile memory cells.

It may be determined that a set of non-volatile memory cells does not pass an erase-verify operation if current detected by the sensing circuit 16 during an erase-verify operation is less than a reference current. This may indicate that the erase-verify voltage does not turn the memory cells ON, which may mean that no conductive channel is formed between the source region 4 and drain region 5 of the memory cells to allow current. This may indicate that the threshold voltage of a memory cell being tested is greater than the erase-verify voltage. In response to determining that the set of non-volatile memory cells does not pass an erase-verify operation, the voltage level may be increased and a second pulse applied to the memory cells 1 of the set of the non-volatile memory cells of the memory array 12 to complete the erase operation.

Figure 10:
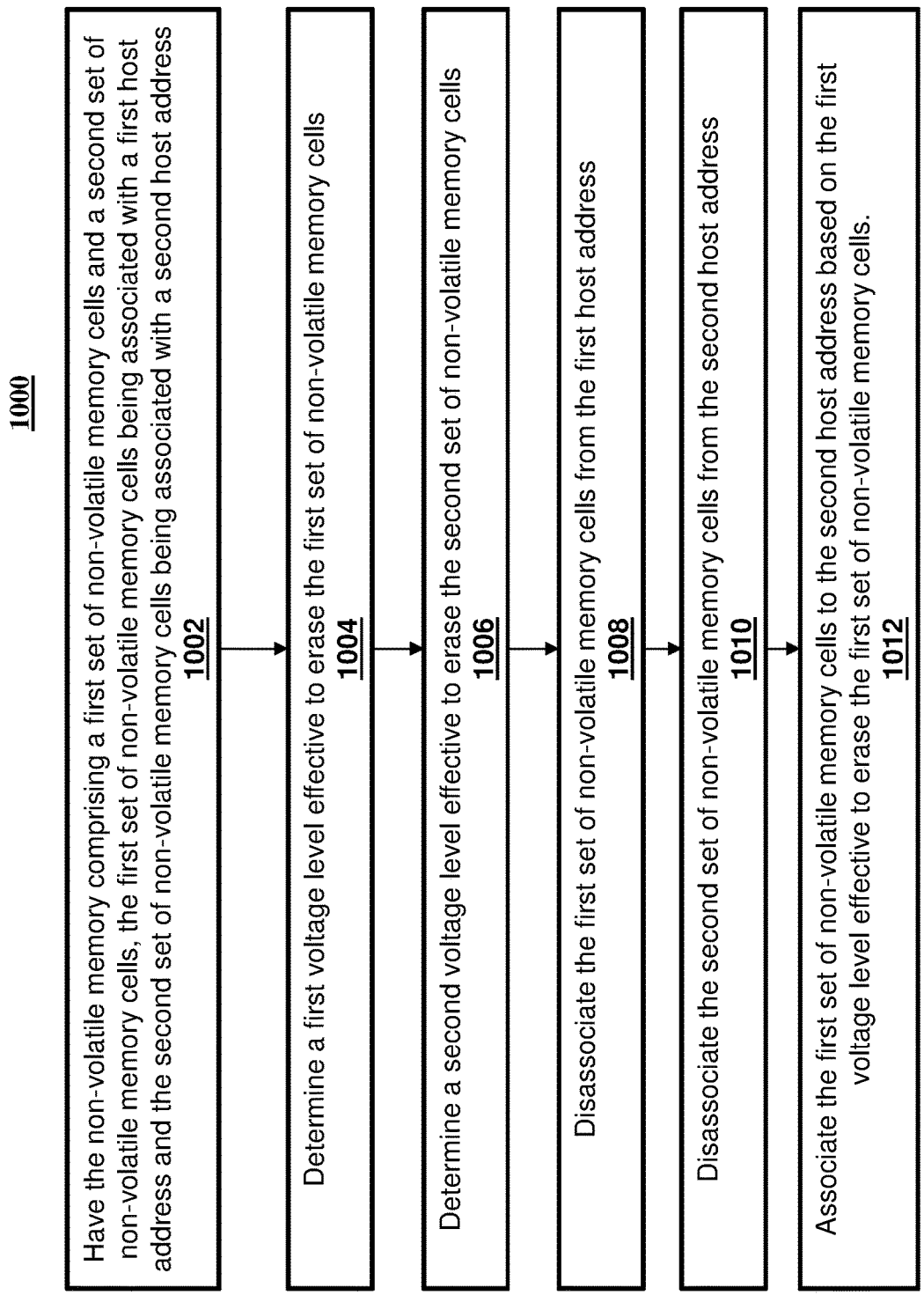
FIG. 10 depicts a flow chart of a method of operating a non-volatile memory.

FIG. 10 depicts a flow chart of a method of operating a non-volatile memory.

The method 1000 may comprise at step 1002 having the non-volatile memory comprising a first set of non-volatile memory cells and a second set of non-volatile memory cells, the first set of non-volatile memory cells being associated with a first host address and the second set of non-volatile memory cells being associated with a second host address. The method 1000 may comprise at a step 1004 determining a first voltage level effective to erase the first set of non-volatile memory cells. The method 1000 may comprise at a step 1006 determining a second voltage level effective to erase the second set of non-volatile memory cells. The method 1000 may comprise at a step 1008 disassociating the first set of non-volatile memory cells from the first host address. The method 1000 may comprise at a step 1010 disassociating the second set of non-volatile memory cells from the second host address. The method 1000 may comprise at a step 1012 associating the first set of non-volatile memory cells to the second host address based on the first voltage level effective to erase the first set of non-volatile memory cells.

In various embodiments of the method 1000 associating the first set of non-volatile memory cells to the second host address may comprises determining the first voltage level is higher than the second voltage level.

In various embodiments, the method 1000 may further comprise: cycling the first set of non-volatile memory cells; and determining the first voltage level is no longer effective to erase the first set of non-volatile memory cells.

In various embodiments, the method 1000 may further comprise: associating the second set of non-volatile memory cells to the first host address based on the second voltage level effective to erase the second set of non-volatile memory cells.

In various embodiments, the method 1000 may further comprise: receiving instructions from a host device that identify the second host address for performing a memory operation; and performing the memory operation on the first set of non-volatile memory cells.

In various embodiments of the method 1000 associating the first set of non-volatile memory cells to the second host address may comprise corresponding the first set of non-volatile memory cells to the second host address in a lookup table.\

In various embodiments, the method 1000 may further comprise: performing an erase operation on the first set of non-volatile memory cells by applying the first voltage level to the first set of non-volatile memory cells.

In various embodiments, the method 1000 may further comprise: storing the first voltage level in a dedicated memory area; determining a new voltage level effective to erase the first set of non-volatile memory cells; and replacing the first voltage level in the dedicated memory area with the new voltage level.

In various embodiments, the method 1000 may further comprise: performing a second erase operation on the first set of non-volatile memory cells by applying the new voltage level to the first set of non-volatile memory cells.

Figure 11:
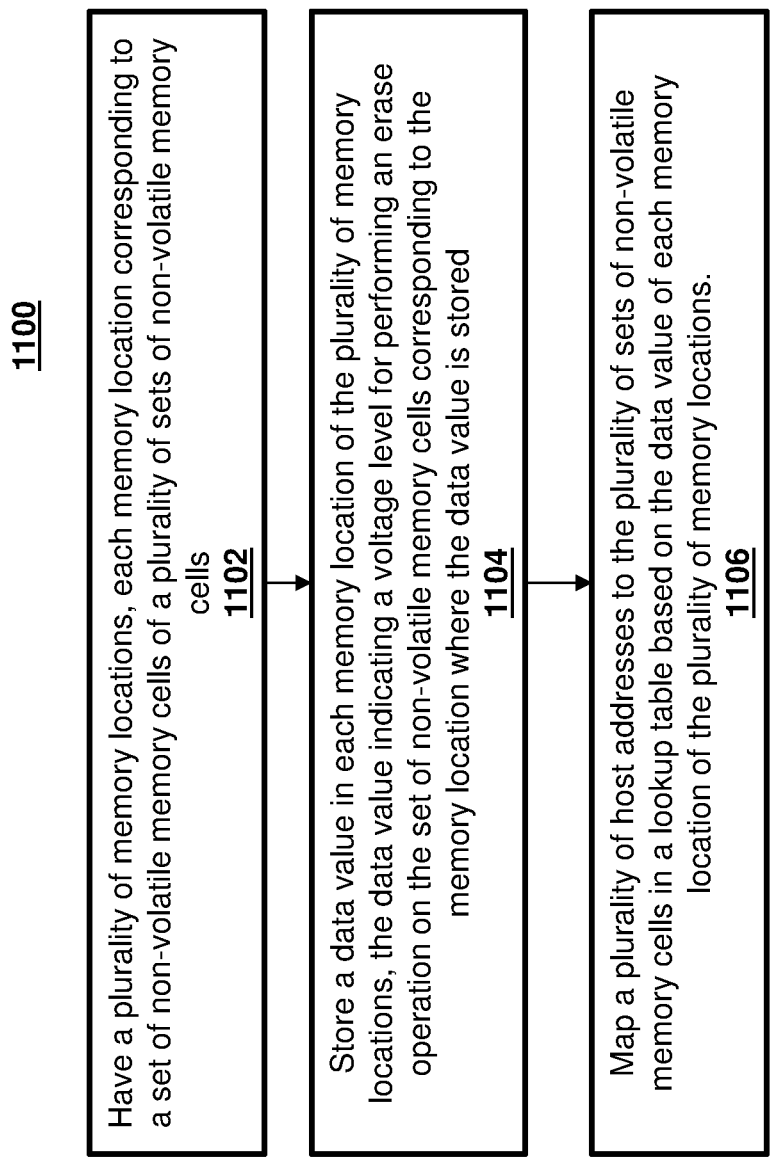
FIG. 11 depicts a flow chart of a method for wear leveling.

FIG. 11 depicts a flow chart of a method 1100 for wear leveling.

The method 1100 may comprises at a step 1102 having a plurality of memory locations, each memory location corresponding to a set of non-volatile memory cells of a plurality of sets of non-volatile memory cells; at a step 1104 the method 1100 may comprise storing a data value in each memory location of the plurality of memory locations, the data value indicating a voltage level for performing an erase operation on the set of non-volatile memory cells corresponding to the memory location where the data value is stored; and at a step 1106 the method 1100 may comprise mapping a plurality of host addresses to the plurality of sets of non-volatile memory cells in a lookup table based on the data value in each memory location of the plurality of memory locations.

In various embodiments, the method 1100 may further comprise receiving an instruction set from a host device to perform a memory operation on a selected set of non-volatile memory cells identified by a host address of the plurality of host addresses; and performing the memory operation on a set of memory locations mapped to the host address of the plurality of host addresses in the lookup table.

The method 1100 may further comprise updating a first data value of a first memory location of the plurality of memory locations.

The method 1100 may further comprise updating the lookup table mapping the plurality of host addresses to the plurality of sets of non-volatile memory cells in the lookup table based on the data value in each memory location of the plurality of memory locations.

Example embodiments of the invention are summarized here. Other embodiments can also be understood from the entirety of the specification as well as the claims filed herein.

Example 1

A method of operating a non-volatile memory, the method including: having the non-volatile memory including a first set of non-volatile memory cells and a second set of non-volatile memory cells, the first set of non-volatile memory cells being associated with a first host address and the second set of non-volatile memory cells being associated with a second host address; determining a first voltage level effective to erase the first set of non-volatile memory cells; determining a second voltage level effective to erase the second set of non-volatile memory cells; disassociating the first set of non-volatile memory cells from the first host address; disassociating the second set of non-volatile memory cells from the second host address; and associating the first set of non-volatile memory cells to the second host address based on the first voltage level effective to erase the first set of non-volatile memory cells.

Example 2

The method of Example 1 wherein associating the first set of non-volatile memory cells to the second host address includes determining the first voltage level is higher than the second voltage level.

Example 3

The method of Example 1 or Example 2 further including cycling the first set of non-volatile memory cells; and determining the first voltage level is no longer effective to erase the first set of non-volatile memory cells.

Example 4

The method of Example 1 to Example 3 further including associating the second set of non-volatile memory cells to the first host address based on the second voltage level effective to erase the second set of non-volatile memory cells.

Example 5

The method of Example 1 to Example 4 further including: receiving instructions from a host device that identify the second host address for performing a memory operation; and performing the memory operation on the first set of non-volatile memory cells.

Example 6

The method of Example 1 to Example 5 wherein associating the first set of non-volatile memory cells to the second host address includes corresponding the first set of non-volatile memory cells to the second host address in a lookup table.

Example 7

The method of Example 1 to Example 6 further including performing an erase operation on the first set of non-volatile memory cells by applying the first voltage level to the first set of non-volatile memory cells.

Example 8

The method of Example 1 to Example 7 further including: storing the first voltage level in a dedicated memory area; determining a new voltage level effective to erase the first set of non-volatile memory cells; and replacing the first voltage level in the dedicated memory area with the new voltage level.

Example 9

The method of Example 1 to Example 8 further including performing a second erase operation on the first set of non-volatile memory cells by applying the new voltage level to the first set of non-volatile memory cells.

Example 10

A non-volatile memory device including: a voltage-level indicator configured to store a data value indicating a voltage level used to perform an erase operation on a first set of non-volatile memory cells; and a controller in communication with the voltage-level indicator and configured to update a lookup table to associate the first set of non-volatile memory cells with a host address based on the data value.

Example 11

The non-volatile memory device of Example 11 wherein the controller is configured to update the voltage-level indicator to store a new voltage level used to perform a subsequent erase operation on the first set of non-volatile memory cells.

Example 12

The non-volatile memory device of Example 10 or Example 11, wherein the controller is configured to receive instructions from a host device that identify the host address to perform a memory operation and wherein the controller is configured to use the lookup table to perform the memory operation on the first set of non-volatile memory cells.

Example 13

The non-volatile memory device of Example 10 to Example 12, wherein the first set of non-volatile memory cells includes a plurality of floating gate memory cells.

Example 14

The non-volatile memory device of Example 10 to Example 13, further including: a biasing circuit configured to apply: an erase voltage to the first set of non-volatile memory cells to erase a data set stored on the first set of non-volatile memory cells; a read voltage to the first set of non-volatile memory cells to read the data set stored on the first set of non-volatile memory cells; and a program voltage to the first set of non-volatile memory cells to program the data set on the first set of non-volatile memory cells; and a sensing circuit configured to read the first set of non-volatile memory cells.

Example 15

The non-volatile memory device of Example 10 to Example 14, wherein the biasing circuit includes a digital to analog converter.

Example 16

The non-volatile memory device of Example 10 to Example 15, wherein the controller is configured: to perform the erase operation by retrieving the data value from the voltage-level indicator to instruct the biasing circuit to provide the erase voltage to the first set of non-volatile memory cells, the erase voltage being determined by the data value; and to perform an erase-verify operation by applying an erase-verify voltage to the first set of non-volatile memory cells and update the data value depending on a result of the erase-verify operation.

Example 17

A method for wear leveling including: having a plurality of memory locations, each memory location corresponding to a set of non-volatile memory cells of a plurality of sets of non-volatile memory cells; storing a data value in each memory location of the plurality of memory locations, the data value indicating a voltage level for performing an erase operation on the set of non-volatile memory cells corresponding to the memory location where the data value is stored; and mapping a plurality of host addresses to the plurality of sets of non-volatile memory cells in a lookup table based on the data value in each memory location of the plurality of memory locations.

Example 18

The method of Example 17 further including: receiving an instruction set from a host device to perform a memory operation on a selected set of non-volatile memory cells identified by a host address of the plurality of host addresses; and performing the memory operation on a set of memory locations mapped to the host address of the plurality of host addresses in the lookup table.

Example 19

The method of Example 17 or Example 18 further including updating a first data value of a first memory location of the plurality of memory locations.

Example 20

The method of Example 17 to Example 19, further including updating the lookup table mapping the plurality of host addresses to the plurality of sets of non-volatile memory cells in the lookup table based on the data value in each memory location of the plurality of memory locations.

Finally, it is clear that modifications and variations may be made to what has been described and illustrated herein, without thereby departing from the scope of the present invention, as defined in the appended claims.

References to illustrative embodiments in this description are not intended to be construed in a limiting sense. Various modifications and combinations of the illustrative embodiments, as well as other embodiments will be apparent to persons skilled in the art upon reference to the description. It is therefore intended that the appended claims encompass any such modifications or embodiments.

What is claimed is:

1. A method of operating a non-volatile memory, the method comprising:
having the non-volatile memory comprising a first set of non-volatile memory cells and a second set of non-volatile memory cells, the first set of non-volatile memory cells being associated with a first host address and the second set of non-volatile memory cells being associated with a second host address;
determining a first voltage level effective to erase the first set of non-volatile memory cells;
determining a second voltage level effective to erase the second set of non-volatile memory cells;
disassociating the first set of non-volatile memory cells from the first host address;
disassociating the second set of non-volatile memory cells from the second host address;
associating the first set of non-volatile memory cells to the second host address based on the first voltage level effective to erase the first set of non-volatile memory cells;
determining a new voltage level effective to erase the first set of non-volatile memory cells; and
using the new voltage level as an initial voltage pulse for performing a future erase operation on the first set of non-volatile memory cells.

2. The method of claim 1 wherein associating the first set of non-volatile memory cells to the second host address comprises determining the first voltage level is higher than the second voltage level.

3. The method of claim 1 further comprising:
cycling the first set of non-volatile memory cells; and
determining the first voltage level is no longer effective to erase the first set of non-volatile memory cells.

4. The method of claim 1 further comprising:
associating the second set of non-volatile memory cells to the first host address based on the second voltage level effective to erase the second set of non-volatile memory cells.

5. The method of claim 1 further comprising:
receiving instructions from a host device that identify the second host address for performing a memory operation; and
performing the memory operation on the first set of non-volatile memory cells.

6. The method of claim 1 wherein associating the first set of non-volatile memory cells to the second host address comprises corresponding the first set of non-volatile memory cells to the second host address in a lookup table.

7. The method of claim 1 further comprising performing an erase operation on the first set of non-volatile memory cells by applying the first voltage level to the first set of non-volatile memory cells.

8. The method of claim 7 further comprising:
storing the first voltage level in a dedicated memory area; and
replacing the first voltage level in the dedicated memory area with the new voltage level after determining that the new voltage level effective to erase the first set of non-volatile memory cells.

9. A non-volatile memory device comprising:
a voltage-level indicator configured to store a data value indicating a voltage level used to perform an erase operation on a first set of non-volatile memory cells; and
a controller in communication with the voltage-level indicator and configured to update a lookup table to associate the first set of non-volatile memory cells with a host address based on the data value.

10. The non-volatile memory device of claim 9 wherein the controller is configured to update the voltage-level indicator to store a new voltage level used to perform a subsequent erase operation on the first set of non-volatile memory cells.

11. The non-volatile memory device of claim 9, wherein the controller is configured to receive instructions from a host device that identify the host address to perform a memory operation and wherein the controller is configured to use the lookup table to perform the memory operation on the first set of non-volatile memory cells.

12. The non-volatile memory device of claim 9, wherein the first set of non-volatile memory cells comprises a plurality of floating gate memory cells.

13. The non-volatile memory device of claim 9, further comprising:
a biasing circuit configured to apply: an erase voltage to the first set of non-volatile memory cells to erase a data set stored on the first set of non-volatile memory cells;

a read voltage to the first set of non-volatile memory cells to read the data set stored on the first set of non-volatile memory cells; and a program voltage to the first set of non-volatile memory cells to program the data set on the first set of non-volatile memory cells; and a sensing circuit configured to read the first set of non-volatile memory cells.

14. The non-volatile memory device of claim 13, wherein the biasing circuit comprises a digital to analog converter.

15. The non-volatile memory device of claim 13, wherein the controller is configured:

to perform the erase operation by retrieving the data value from the voltage-level indicator to instruct the biasing circuit to provide the erase voltage to the first set of non-volatile memory cells, the erase voltage being determined by the data value; and to perform an erase-verify operation by applying an erase-verify voltage to the first set of non-volatile memory cells and update the data value depending on a result of the erase-verify operation.

16. A method for wear leveling comprising:

having a plurality of memory locations, each memory location corresponding to a set of non-volatile memory cells of a plurality of sets of non-volatile memory cells;

storing a data value in each memory location of the plurality of memory locations, the data value indicating a voltage level for performing an erase operation on the set of non-volatile memory cells corresponding to the memory location where the data value is stored; and mapping a plurality of host addresses to the plurality of sets of non-volatile memory cells in a lookup table based on the data value in each memory location of the plurality of memory locations.

17. The method of claim 16 further comprising:

receiving an instruction set from a host device to perform a memory operation on a selected set of non-volatile memory cells identified by a host address of the plurality of host addresses; and performing the memory operation on a set of memory locations mapped to the host address of the plurality of host addresses in the lookup table.

18. The method of claim 17 further comprising updating a first data value of a first memory location of the plurality of memory locations.

19. The method of claim 18, further comprising updating the lookup table mapping the plurality of host addresses to the plurality of sets of non-volatile memory cells in the lookup table based on the data value in each memory location of the plurality of memory locations.

* * * * *